US012652058B2

(12) United States Patent
Innocent

(10) Patent No.: US 12,652,058 B2
(45) Date of Patent: Jun. 9, 2026

(54) SINGLE-ENDED ANALOG-TO-DIGITAL CONVERTER INPUT STAGE WITH TRANSISTOR-BASED CAPACITANCE

(71) Applicant: SEMICONDUCTOR COMPONENTS INDUSTRIES, LLC, Scottsdale, AZ (US)

(72) Inventor: Manuel H. Innocent, Wezemaal (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 149 days.

(21) Appl. No.: 18/592,188

(22) Filed: Feb. 29, 2024

(65) Prior Publication Data

US 2025/0279786 A1      Sep. 4, 2025

(51) Int. Cl.
*H03M 1/12* (2006.01)
*H03M 1/46* (2006.01)

(52) U.S. Cl.
CPC ......... *H03M 1/1245* (2013.01); *H03M 1/466* (2013.01)

(58) Field of Classification Search
CPC ........................... H03M 1/1245; H03M 1/466
USPC ........................................................ 341/155
See application file for complete search history.

(56) References Cited

U.S. PATENT DOCUMENTS 10,432,211 B1      10/2019  Innocent
11,139,789 B1 *    10/2021  Kusuda ...................... H03F 3/72
11,239,856 B1       2/2022  Innocent 2002/0093368 A1 *   7/2002  Fulkerson .............. H03K 3/012
                                                          327/203
2006/0181622 A1     8/2006  Hong
2011/0083685 A1 *   4/2011  Adams ..................... A24F 23/00
                                                          131/347
2014/0002049 A1 *   1/2014  Schrom .............. H02M 3/1588
                                                          323/311
2021/0083685 A1 *   3/2021  Spagnolo .............. H03M 1/804
2022/0208814 A1     6/2022  Innocent

FOREIGN PATENT DOCUMENTS

DE       102021119375 A1     2/2023

OTHER PUBLICATIONS

Rabuske, T. et al., "A 9-b 0.4-V charge-mode SAR ADC with 1.6-V input swing and a MOSCAP-only DAC", In ESSCIRC Conference 2015-41st European Solid-State Circuits Conference (ESSCIRC), Sep. 2015, pp. 311-314.

* cited by examiner

*Primary Examiner* — Peguy Jean Pierre
(74) *Attorney, Agent, or Firm* — Brake Hughes Bellermann LLP

(57) ABSTRACT

An illustrative input stage for an analog-to-digital converter circuit is described herein. The input stage may include a first transistor of a first conductivity type connected between a first node and a second node; a second transistor of a second conductivity type connected between the first node and a third node; and a set of switches. The set of switches may be configured, when manipulated by a controller, to connect the first node to either an input node or a first output node, the second node to either a first reference node or a second output node, and the third node to either a second reference node or the second output node. Corresponding analog-to-digital conversion circuits and procedures making use of this input stage, as well as corresponding systems, circuitry, and methods, are also disclosed.

20 Claims, 12 Drawing Sheets

Input 1

Input 2

Comparator

Controller

720

SINGLE-ENDED ANALOG-TO-DIGITAL CONVERTER INPUT STAGE WITH TRANSISTOR-BASED CAPACITANCE

TECHNICAL FIELD

This description relates to analog-to-digital conversion circuitry such as may be implemented within image sensors and/or other electronic devices.

BACKGROUND

For many real-world phenomena to be analyzed electronically, the phenomena may first be measured or detected in an analog form, then converted into a digital form that may be analyzed using various types of digital information processing. As one example, an image sensor may include a two-dimensional array of image sensing pixels arranged in rows and columns. Each of these pixels may include a photosensitive layer that receives incident photons (light) and converts the photons into electrical charge that may be read out row by row (with the various columns for each row being read out using parallel circuitry). To analyze and process the information captured by these pixels, charge captured by each pixel (or an analog voltage signal indicative of that charge) may be converted into a digital value using analog-to-digital converter circuitry. Image sensors utilizing such analog-to-digital converter circuitry may be included as part of various systems and devices including digital cameras, vehicles, security systems, robotic systems, mobile devices, and so forth. Analog-to-digital conversion circuitry may also be used in various other types of applications and use cases other than image sensing. For instance, these and other systems and devices may use analog-to-digital circuitry to monitor and/or analyze sound, temperature, biological vital signs, control signals, environmental conditions, and various other phenomena.

SUMMARY

Various implementations of a single-ended analog-to-digital converter input stage with transistor-based capacitance are described herein. Many conventional analog-to-digital converter circuits require a differential input signal having a different voltage range than the original single-ended analog signal that is to be converted. Accordingly, these conventional analog-to-digital converter circuits have required a pre-amplification buffer before their input stage to convert the single-ended signal into a differential signal in the desired voltage range. When implemented with discrete components, this has typically required an extra chip between the analog sensing device that generates the analog signal and the analog-to-digital converter chip performing the conversion. When implemented within an integrated circuit, this pre-amplification may be performed on-chip, but still requires power and area from potentially very stringent power and area budgets of the integrated circuit. In contrast, analog-to-digital converter circuitry described herein is configured with an input stage that has various advantages over these conventional designs. First, the input stage of various analog-to-digital converter circuits described herein may be configured to passively (without using additional power) and quickly convert a single-ended input signal into a differential signal that can be used in the analog-to-digital conversion. Second, the input stage passively and quickly shifts the input voltage level to a desired range in which the analog-to-digital conversion can be performed. Third, the input stage operates in the charge domain (such that charge, rather than voltage, is the quantity conserved and analyzed) and reduces the capacitance during the conversion procedure so as to provide a voltage boost that helps make the circuit less sensitive to noise in spite of it being low power and high speed.

To address the challenges described above and provide the advantages mentioned, systems and methods described herein implement a single-ended analog-to-digital converter input stage that uses transistor-based capacitance, such as may be provided by Complementary Metal-Oxide-Semiconductor (CMOS) transistors or other suitable transistors as may serve a particular implementation. More particularly, an input stage for an analog-to-digital converter circuit may include: 1) a first transistor of a first conductivity type, the first transistor being connected between a first node and a second node; 2) a second transistor of a second conductivity type, the second transistor being connected between the first node and a third node; and 3) a set of switches.

Transistors may be constructed with different semiconductor materials to give the transistors different properties. For example, certain transistors may be built to have a P-type conductivity while others may be built to have an N-type conductivity. If CMOS technology is used for the transistors, a transistor with P-type conductivity may be implemented by a P-channel Metal-Oxide-Semiconductor (PMOS) transistor, while a transistor with N-type conductivity may be implemented by an N-channel Metal-Oxide-Semiconductor (NMOS) transistor. Referring to the input stage described above, the conductivity types of the first and second transistors may be the same or different, such that any combination of transistors may be used in a particular implementation. For example, as will be described an illustrated in more detail below, a P-type transistor (such as a PMOS transistor) and an N-type transistor (such as an NMOS transistor) may be used in certain implementations, while, in other implementations, two transistors of the same conductivity type (two P-type transistors, two N-type transistors, etc.) may be used. In still other implementations, combinations of more than two transistors may be used in accordance with principles described and illustrated herein.

When manipulated by a controller, the switches are configured to connect: (a) the first node to either an input node or a first output node, (b) the second node to either a first reference node or a second output node, and (c) the third node to either a second reference node or the second output node. As will be described and illustrated in more detail, the manipulation of the switches may serve to put the input stage into different configurations at different times to thereby perform the desirable functionality described herein.

As mentioned above, any combination of conductivity types may be employed in the first and second transistors of an input stage such as described above. These combinations will be referred to herein by the letters P and N, as noted more specifically below. The way that the transistors are connected between the first, second, and third nodes may depend on the combination of transistors being used. As a first example (a PN combination), the first conductivity type may be a P-type and the second conductivity type may be an N-type. In this example, the first transistor may be connected between the first node and the second node by a first gate of the first transistor connecting to the first node and a first source and a first drain of the first transistor both connecting to the second node. The second transistor may then be connected between the first node and the third node by a second gate of the second transistor connecting to the first node and a second source and a second drain of the second transistor both connecting to the third node. As a second example (a PP combination), the first conductivity type and the second conductivity type may both be P-type. In this example, the first transistor may be connected between the first node and the second node by a first gate of the first transistor connecting to the first node and a first source and a first drain of the first transistor both connecting to the second node. The second transistor may then be connected between the first node and the third node by a second source and a second drain of the second transistor both connecting to the first node and a second gate of the second transistor connecting to the third node. As a third example (an NP combination), the first conductivity type may be an N-type and the second conductivity type may be a P-type. In this example, the first transistor may be connected between the first node and the second node by a first source and a first drain of the first transistor both connecting to the first node and a first gate of the first transistor connecting to the second node. The second transistor may then be connected between the first node and the third node by a second source and a second drain of the second transistor both connecting to the first node and a second gate of the second transistor connecting to the third node. As a fourth example (an NN combination), the first conductivity type and the second conductivity type may both be an N-type. In this example, the first transistor may be connected between the first node and the second node by a first source and a first drain of the first transistor both connecting to the first node and a first gate of the first transistor connecting to the second node. The second transistor may then be connected between the first node and the third node by a second gate of the second transistor connecting to the first node and a second source and a second drain of the second transistor both connecting to the third node.

An input stage for an analog-to-digital converter circuit, such as the example implementation described above, may include a variety of additional elements, features, characteristics, and so forth.

As one example, the input node may be configured to receive a single-ended signal as an input to the analog-to-digital converter circuit. The analog-to-digital converter circuit may implement a charge-sharing successive-approximation-register (CS-SAR) analog-to-digital converter that operates in a charge domain instead of a voltage domain.

As another example, the input stage may be one of a plurality of input stages that share parallel access to a singular comparator and a singular digital-to-analog feedback circuit of the analog-to-digital converter circuit.

As another example, the analog-to-digital converter circuit may be implemented as part of an image readout circuit included within an image sensor integrated circuit. In this example, the input stage may be associated with a particular column of a plurality of columns within the image sensor integrated circuit, and the input stage may receive, at the input node, a single-ended column readout signal for the particular column.

As another example, the set of switches may be manipulated to put the analog-to-digital converter circuit in a sampling configuration in which: 1) the first node is connected to the input node and disconnected from the first output node; 2) the second node is connected to the first reference node and disconnected from the second output node; and 3) the third node is connected to the second reference node and disconnected from the second output node. The set of switches may also be manipulated to put the analog-to-digital converter circuit in a conversion configuration in which: 1) the first node is connected to the first output node and disconnected from the input node; 2) the second node is connected to the second output node and disconnected from the first reference node; and 3) the third node is connected to the second output node and disconnected from the second reference node. In some cases, the set of switches is manipulated to put the analog-to-digital converter circuit in the conversion configuration during a conversion phase. At a first time during the conversion phase, at least one of the first transistor or the second transistor may be activated such that a transistor capacitance is enabled for use in storing a sampled charge that was captured during a sampling phase prior to the first time. At a second time during the conversion phase, both the first transistor and the second transistor may be deactivated such that the transistor capacitance is disabled, and a corresponding voltage boost is applied between the first output node and the second output node as the sampled charge is conserved. Based on the sampled charge conserved within a capacitance between the first output node and the second output node when the analog-to-digital converter circuit is in the conversion configuration, a differential signal corresponding to the sampled charge may be generated on the first output node and the second output node, and this differential signal may be received by a first input and a second input of a comparator that is further included within the analog-to-digital converter circuit (after the input stage).

As another example, the first transistor may have a first bulk terminal and the second transistor may have a second bulk terminal. The set of switches may then be further configured, when manipulated by the controller, to connect: 1) the first bulk terminal to either the first reference node or a first shifted supply node, and 2) the second bulk terminal to either the second reference node or a second shifted supply node. In some cases, these features may be used to manipulate the set of switches to put the analog-to-digital converter circuit in a voltage-shift configuration. In the voltage-shift configuration: 1) the first bulk terminal may be connected to the first shifted supply node; 2) the second bulk terminal may be connected to the second shifted supply node; 3) the first node may be floating disconnected from both the input node and the first output node; 4) the second node may be floating disconnected from both the first reference node and the second output node; and 5) the third node may be floating disconnected from both the second reference node and the second output node.

In another example implementation, an analog-to-digital converter circuit includes: 1) a comparator having a first input and a second input; 2) an input stage including: (a) a first transistor of a first conductivity type, the first transistor being connected between a first node and a second node, and (b) a second transistor of a second conductivity type, the second transistor being connected between the first node and a third node; 3) a digital-to-analog feedback circuit including a series of successive-approximation capacitors; and 4) a set of switches. In this implementation, when manipulated by a controller (which may also be included in the analog-to-digital converter circuit in certain examples), the set of switches may be configured to connect: 1) the node to either an input node or the first input of the comparator, 2) the second node to either a first reference node or the second input of the comparator, 3) the third node to either a second reference node or the second input of the comparator, and 4) with either a positive polarity or a negative polarity, each capacitor of the series of successive-approximation capacitors between the first input and the second input of the comparator.

As mentioned above, the first and second transistors may each be of P-type or N-type and may be connected between the first, second, and third nodes in a manner dependent on their conductivity type. For instance, a PN combination may be used in which the first conductivity type is a P-type and the second conductivity type is an N-type. In this example, the first transistor may be connected between the first node and the second node by a first gate of the first transistor connecting to the first node and a first source and a first drain of the first transistor both connecting to the second node. The second transistor may then be connected between the first node and the third node by a second gate of the second transistor connecting to the first node and a second source and a second drain of the second transistor both connecting to the third node. In other implementations, other combinations such as PP, NP, and NN combinations of transistors may be used similarly as described above.

An analog-to-digital converter circuit, such as the example implementation described above, may include a variety of additional elements, features characteristics, and so forth.

As one example, the input node may be configured to receive a single-ended signal as an input to the analog-to-digital converter circuit. The analog-to-digital converter circuit may also implement a charge-sharing successive-approximation-register (CS-SAR) analog-to-digital converter that operates in a charge domain instead of a voltage domain.

As another example, the set of switches may be further configured, when manipulated by the controller, to connect each capacitor of the series of successive approximation capacitors between a first precharge reference node and a second precharge reference node (such as during a phase prior to a conversion phase).

As another example, the set of switches may be manipulated to put the analog-to-digital converter circuit in a conversion configuration in which: 1) the first node is connected to the first input of the comparator and disconnected from the input node; 2) the second node is connected to the second input of the comparator and disconnected from the first reference node; 3) the third node is connected to the second input of the comparator and disconnected from the second reference node; and 4) each capacitor of the series of successive approximation capacitors is connected with either the positive polarity or the negative polarity between the first input and the second input of the comparator so as to inversely match a sampled charge captured by the input stage when the analog-to-digital converter circuit was in a sampling configuration prior to being put in the conversion configuration.

As another example, the analog-to-digital converter circuit may further include an additional input stage that is configured to share parallel access, with the input stage mentioned above, to the comparator and the digital-to-analog feedback circuit.

In yet another example implementation, a method is performed for an analog-to-digital converter circuit that includes an input stage with a first transistor of a first conductivity type connected between a first node and a second node and a second transistor of a second conductivity type connected between the first node and a third node. The method may include operations such as: 1) manipulating a set of switches to put the analog-to-digital converter circuit in a sampling configuration, and 2) manipulating the set of switches to put the analog-to-digital converter circuit in a conversion configuration. When the analog-to-digital converter circuit is in the sampling configuration, 1) the first node is connected to an input node and disconnected from a comparator, 2) the second node is connected to a first reference node and disconnected from the comparator, and 3) the third node connected to a second reference node and disconnected from the comparator. In contrast, when the analog-to-digital converter circuit is in the conversion configuration, 1) the first node is disconnected from the input node and connected to a first input of the comparator, 2) the second node is disconnected from the first reference node and connected to a second input of the comparator, and 3) the third node is disconnected from the second reference node and connected to the second input of the comparator.

As mentioned above, the first and second transistors may each be of P-type or N-type and may be connected between the first, second, and third nodes in a manner dependent on their conductivity type. For instance, a PN combination may be used in which the first conductivity type is a P-type and the second conductivity type is an N-type. In this example, the first transistor may be connected between the first node and the second node by a first gate of the first transistor connecting to the first node and a first source and a first drain of the first transistor both connecting to the second node. The second transistor may then be connected between the first node and the third node by a second gate of the second transistor connecting to the first node and a second source and a second drain of the second transistor both connecting to the third node. In other implementations, other combinations such as PP, NP, and NN combinations of transistors may be used similarly as described above.

A method such as the example method described above may include a variety of additional elements, features characteristics, and so forth.

For example, the method may be performed with the input node being configured to receive a single-ended signal as an input to the analog-to-digital converter circuit, and with the analog-to-digital converter circuit implementing a charge-sharing successive-approximation-register (CS-SAR) analog-to-digital converter that operates in a charge domain instead of a voltage domain.

As another example, the method may further include manipulating the set of switches to put the analog-to-digital converter circuit in a voltage-shift configuration (for instance, after the sampling configuration and before the conversion configuration). In the voltage-shift configuration: 1) a first bulk terminal of the first transistor may be connected to a first shifted supply node; 2) a second bulk terminal of the second transistor may be connected to a second shifted supply node; 3) the first node may be floating disconnected from both the input node and the first input of the comparator; 4) the second node may be floating disconnected from both the first reference node and the second input of the comparator; and 5) the third node may be floating disconnected from both the second reference node and the second input of the comparator.

As another example, the method may be performed with the analog-to-digital converter circuit being implemented as part of an image readout circuit included within an image sensor integrated circuit, such that the manipulating of the set of switches to put the analog-to-digital converter circuit in the sampling configuration and in the conversion configuration may be performed as steps of an image readout procedure performed by the image readout circuit.

The details of these and other implementations are set forth in the accompanying drawings and the description below. Other features will also be apparent from the following description, drawings, and claims.

DETAILED DESCRIPTION

Figure 1:
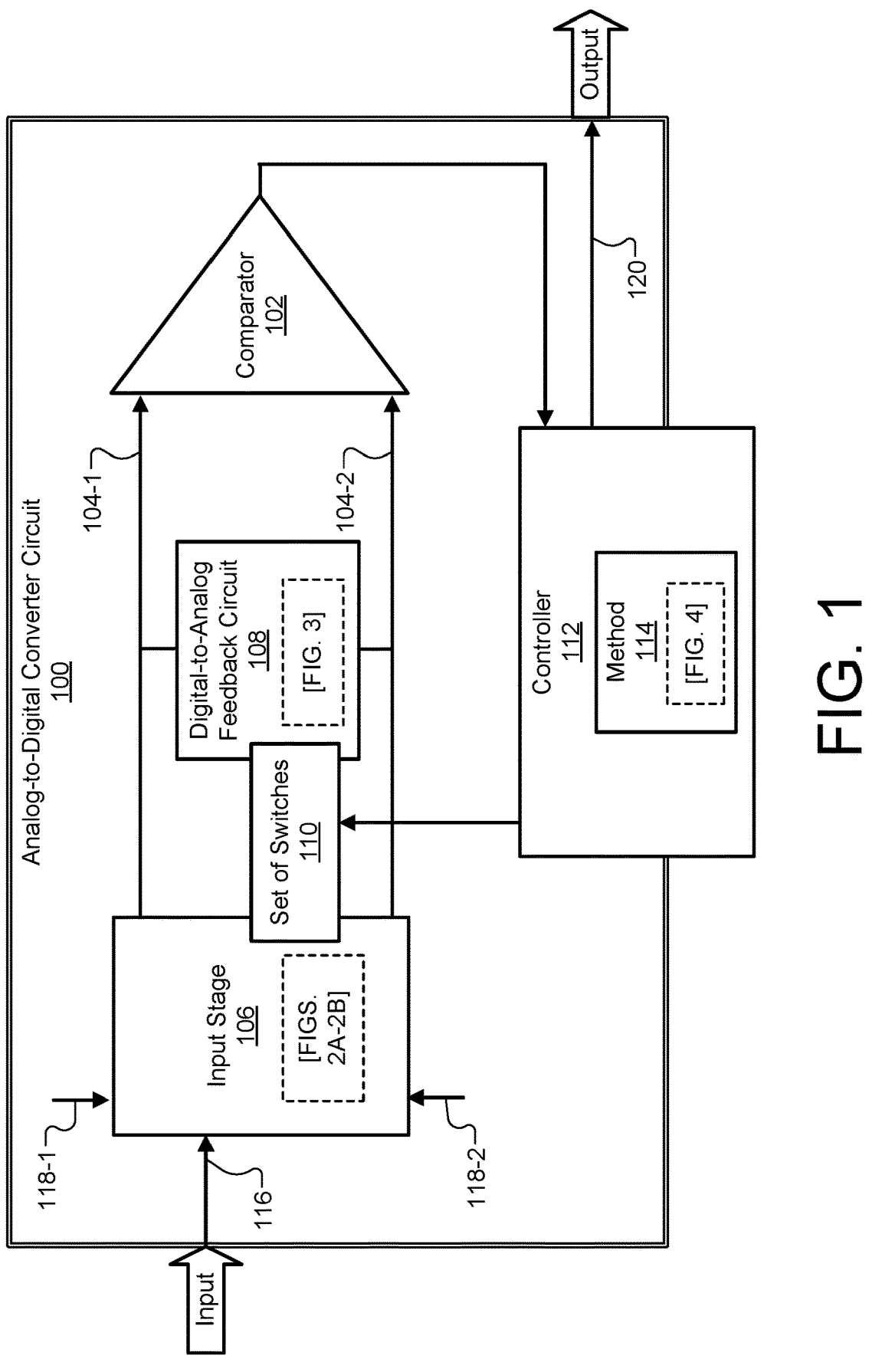
FIG. 1 shows a block diagram of an illustrative analog-to-digital converter circuit having a single-ended input stage in accordance with principles described herein.

Various implementations of a single-ended analog-to-digital converter input stage with transistor-based capacitance (such as provided by Complementary Metal-Oxide-Semiconductor (CMOS) transistors or other suitable transistors) are described herein. As mentioned above, there are a variety of uses for analog-to-digital conversion circuitry in modern electronic applications. One example that will be described herein involves image sensors that create analog signals representative of detected light and convert those analog signals to digital values that can be processed digitally to generate and manipulate digital images. It will be understood, however, that many other example applications and use cases, in which analog signals are generated based on various phenomena, may be similarly configured to make use of analog-to-digital converter circuits such as those described herein.

Regardless of the application or use case, it may often be the case that an analog signal that is to be converted into a digital signal is initially generated as a single-ended signal from some type of analog sensor. For instance, a column readout signal associated with a particular pixel within an image sensor may generally be a single-ended voltage signal that is to be converted into a digital value for that pixel. This analog signal may also tend to be generated within a particular voltage range in which the sensor operates (in a range of the photosensitive light detection element of the pixel in the image sensor example). A technical problem therefore may arise when this analog signal is to be processed by an analog-to-digital converter circuit that is configured to operate with differential signals in a different voltage range (such as a lower voltage range). Conventionally, this technical problem has been addressed by adding an active amplifier stage prior to the analog-to-digital converter circuit to prepare the analog signal by shifting its voltage, converting it to a differential signal, and so forth. This type of amplifier stage may consume power and area on an integrated circuit (or may require a separate chip in a discrete component example) where such power and area resources may be scarce.

Accordingly, analog-to-digital converter circuits described herein include an input stage that uses transistor-based capacitance to passively address each of these technical challenges in a manner that eliminates the need for a pre-amplifier stage, or at least mitigates the problem by significantly reducing what pre-amplification is performed on the signal enroute to the analog-to-digital converter circuit. Specifically, as will be further illustrated and described below, analog-to-digital converter circuits described herein may implement charge-sharing successive-approximation-register (CS-SAR) analog-to-digital converters that operate in a charge domain instead of a voltage domain. The input stage for these CS-SAR analog-to-digital converter circuits may sample the charge provided by a single-ended signal that is received as an input to the analog-to-digital converter circuit and store that sampled charge on at least two transistors that are interconnected in a particular manner based on their respective conductivity types (P-type or N-type).

As mentioned above, transistors may be constructed with different semiconductor materials to give the transistors different properties. For example, certain transistors may be built to have a P-type conductivity while others may be built to have an N-type conductivity. If CMOS technology is used for the transistors, a transistor with P-type conductivity may be implemented by a P-channel Metal-Oxide-Semiconductor (PMOS) transistor, while a transistor with N-type conductivity may be implemented by an N-channel Metal-Oxide-Semiconductor (NMOS) transistor. In some implementations of input stages described herein, the conductivity types of the first and second transistors may be the same, while in other implementations the conductivity types may be different. As enumerated above and described and illustrated in more detail below, for example, any of a PN, PP, NP, or NN combination of transistors, or other suitable combinations (such as using more than two transistors) may be employed in a given implementation. Though any of these transistor combinations may be suitable for implementing principles described herein, most examples described and illustrated herein relate to PN combinations of CMOS transistors. In these examples, a first transistor has a P-type conductivity and is implemented as a PMOS transistor, and a second transistor has an N-type conductivity transistor and is implemented as an NMOS transistor. In spite of this focus on PN combinations in the examples, it will be understood that transistor technologies other than CMOS and transistor combinations other than a PN combination (in which the first transistor is P-type and the second transistor is N-type) may additionally or alternatively employed.

By reconfiguring the connections between any suitable transistor combination described herein using a set of controller-manipulated switches, the sampled charge captured from the single-ended input signal may then be represented by a differential signal passively constructed from the capacitance of the transistors. This differential signal may then be used by the CS-SAR analog-to-digital converter circuit in its conversion phase (after the sampling is complete).

Additionally, if the voltage of the input signal is not within a desirable voltage range for the CS-SAR analog-to-digital converter circuit, the combination of transistors used as sampling capacitors for the input may also be used to perform a passive and fast voltage shift to a desirable voltage range after the sampling phase is complete and before the conversion phase begins. During conversion, as a digital-to-analog feedback circuit and a comparator work with the controller to match the sampled charge and determine a digital value corresponding to the sampled analog charge, the transistors automatically deactivate as the differential voltage on them progressively attenuates toward the mid-scale value. This deactivation provides yet another advantage for the circuit that a conventional capacitor would not provide. By shutting off their capacitance (while the circuit still conserves charge), the transistor-based capacitors provide a voltage boost on the differential signal that helps determine an accurate digital value and makes the circuit less sensitive to noise such as noise generated by the active comparator circuitry.

Accordingly, implementations of the single-ended input stage described herein with transistor-based capacitance allow for all the advantages of CS-SAR analog-to-digital converter circuits, including low power, high speed, and compact area. At the same time, various compromises, such as noise sensitivity as the voltage produced by the sample charge attenuates during conversion, pre-amplifier stages needed to actively shift voltage levels and/or convert single-ended signals to differential signals, etc., that might otherwise accompany the benefits of CS-SAR analog-to-digital converter circuits may be avoided or mitigated by use of this input stage.

Various implementations will now be described in more detail with reference to the figures. It will be understood that the particular implementations described below are provided as non-limiting examples and may be applied in various situations. Additionally, it will be understood that other implementations not explicitly described herein may also fall within the scope of the claims set forth below. Implementations of analog-to-digital converter circuits and associated single-ended input stages with transistor-based capacitance described herein may result in any or all of the technical benefits mentioned above, as well as various additional technical benefits that will be described and/or made apparent below.

FIG. 1 shows a block diagram of an illustrative analog-to-digital converter (ADC) circuit 100 having a single-ended input stage in accordance with principles described herein. As will be described and set forth below, analog-to-digital converter circuits such as ADC circuit 100 may be implemented in a variety of ways and with a variety of optional features that may be used in any combination as may serve a particular implementation. The block diagram of ADC circuit 100 in FIG. 1 is therefore presented as a high-level representation of certain features that may be common to many or all of the analog-to-digital converter circuit implementations described herein, and various additional implementations with different specific features and combinations of features will be described and illustrated below utilizing the same or related reference numbers as those introduced in relation to FIG. 1. In particular, certain components illustrated in ADC circuit 100 may be illustrated in more detail in later figures, as indicated in FIG. 1 by the dashed line boxes associated with these components (boxes indicating "[FIGS. 2A-2B]", "[FIG. 3]", etc.).

As shown in FIG. 1, ADC circuit 100 may include a comparator 102 having a first input 104-1 and a second input 104-2. As will be described, these inputs may carry a differential signal that is generated by an input stage 106 that includes a first transistor of a first conductivity type that is connected between a first node and a second node, as well as a second transistor of a second conductivity type that is connected between the first node and a third node. While these transistors and nodes are not explicitly shown in FIG. 1, the dashed box on input stage 106 indicates that more detail (including these transistors and their various gate, source, and drain terminals) is illustrated for this component in FIGS. 2A-2B. As mentioned above, it will be understood that the first transistor may be of a first conductivity type, the second transistor may be of a second conductivity type (the same type or a different type as the first conductivity type), and any combination of N-type and P-type may be used if connected properly (as described and illustrated in more detail below). While examples described and illustrated herein involve CMOS transistors, where PMOS transistors are used for P-type transistors and NMOS transistors are used for N-type transistors, it will be understood that the transistors may be implemented using transistor technologies other than CMOS.

The inputs 104-1 and 104-2 to comparator 102 are also shown to be coupled with a digital-to-analog (DAC) feedback circuit 108 that may include a series of successive-approximation capacitors. Here again, while these successive approximation capacitors are not explicitly shown in FIG. 1, the dashed box on DAC feedback circuit 108 indicates that more detail (including this series of capacitors) is illustrated for this component in FIG. 3. ADC circuit 100 is further shown to include a set of switches 110 that are configured to be manipulated by a controller 112. The set of switches 110 is drawn as spanning across input stage 106 and DAC feedback circuit 108 to illustrate that one or more switches 110 included in the set that controller 112 manipulates may be included in each of these components. Specific switches within input stage 106 and DAC feedback circuit 108 will be illustrated in schematic diagrams below, such as in FIGS. 2A and 3.

Controller 112 is drawn as being halfway in and halfway out of ADC circuit 100 to illustrate that this component may or may not be included as part of ADC circuit 100. For instance, in certain implementations, controller 112 may be implemented by circuitry that is part of the ADC circuit 100 and is located near these other components. In other implementations, controller 112 may be implemented separately and apart from ADC circuit 100 so as to, for example, control a plurality of similar analog-to-digital converter circuits (including ADC circuit 100) and/or control other functions of other circuits besides the analog-to-digital converter circuits. In either type of implementation, FIG. 1 shows that controller 112 may perform manipulations of the set of switches 110 in accordance with a method 114 that will be described in more detail with reference to FIG. 4.

ADC circuit 100 is further shown in FIG. 1 to include one or more inputs (collectively represented by the arrow labeled "Input") such as an input node 116, a first reference node 118-1, and a second reference node 118-2. As shown, input node 116 may be configured to receive a single-ended signal as an input to ADC circuit 100, while input stage 106 may passively convert this single-ended signal into a differential signal on first input 104-1 and second input 104-2, thereby supporting an implementation of ADC circuit 100 as a charge-sharing successive-approximation-register (CS-SAR) analog-to-digital converter that operates in the charge domain instead of the voltage domain. Given these inputs, the set of switches 110 may be positioned within input stage 106 such that: 1) the first node may connect to either input node 116 or first input 104-1 of comparator 102; 2) the second node may connect to either first reference node 118-1 or second input 104-2 of comparator 102; 3) the third node may connect to either second reference node 118-2 or second input 104-2 of comparator 102; and 4) each capacitor of the series of successive-approximation capacitors (within DAC feedback circuit 108) may connect with either a positive polarity or a negative polarity between first input 104-1 and second input 104-2 of comparator 102. Various configurations (in which the set of switches 110 is manipulated in different ways) will be described and illustrated below to show the various possibilities this architecture provides.

ADC circuit 100 is further shown in FIG. 1 to include one or more outputs (collectively represented by the arrow labeled "Output"). In particular, a digital output 120 is shown to emerge from controller 112. Digital output 120 may provide, using any suitable number of bits, a digital representation of the single-ended input signal sampled on input node 116 after this analog input is converted to a digital value. Various elements shown in FIG. 1 to be included within or otherwise associated with ADC circuit 100 will now be described in relation to FIGS. 2A-4.

Figure 2A:
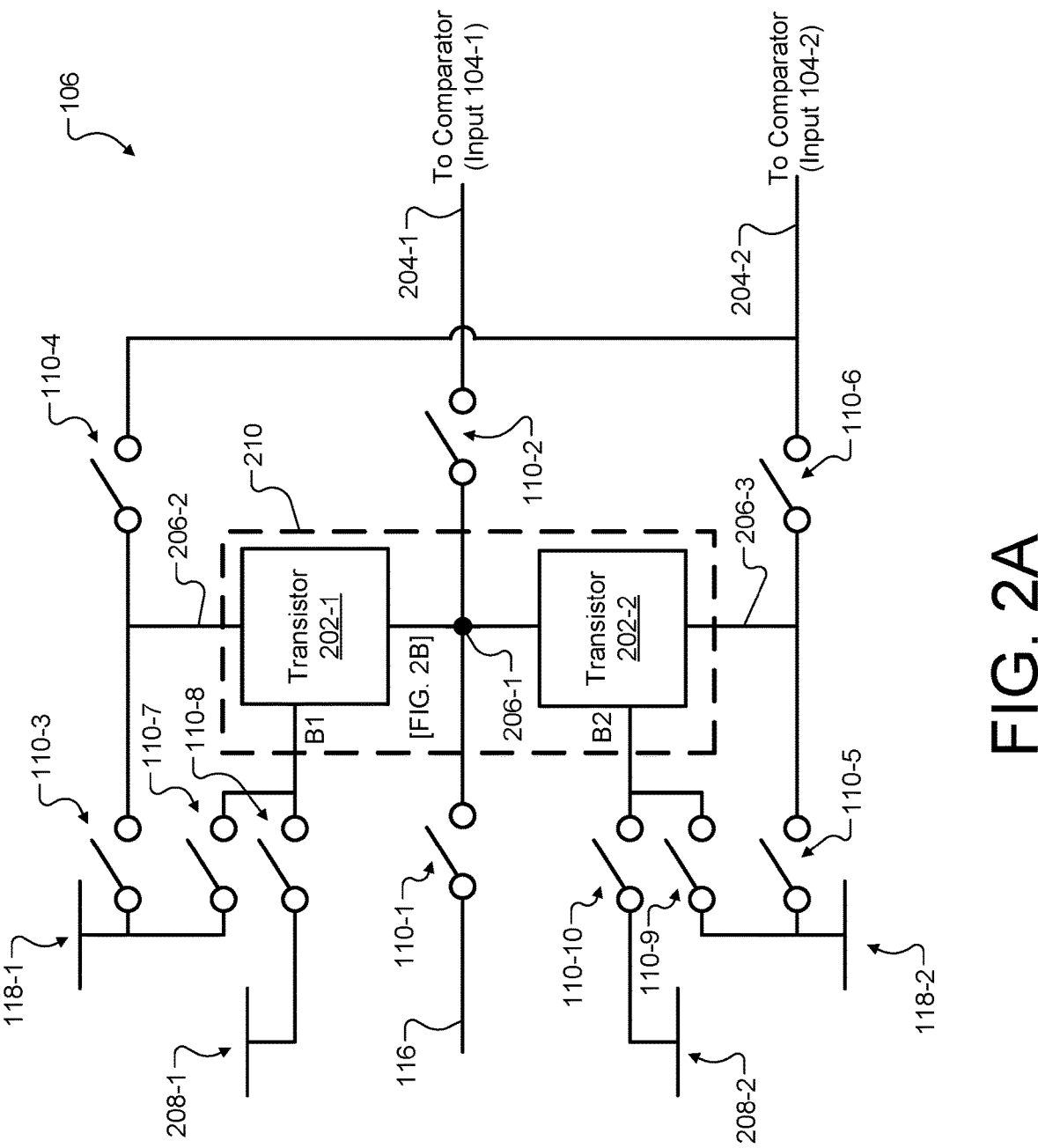
FIG. 2A shows an example schematic diagram of the input stage of the analog-to-digital converter circuit of FIG. 1 in accordance with principles described herein.

FIG. 2A shows an example schematic diagram of input stage 106 of ADC circuit 100. As shown, input stage 106 includes a first transistor 202-1 with a first conductivity type and a second transistor 202-2 with a second conductivity type. As shown, transistor 202-1 is connected between a first node 206-1 and a second node 206-2, while transistor 202-2 is connected between first node 206-1 and a third node 206-3. As described and illustrated in more detail below, terminals of these transistors 202 may be connected to the nodes 206 in a manner that depends on their conductivity type. It is also noted that each transistor is this example is shown to include a bulk terminal (also referred to as a body terminal and labeled 'B1' and 'B2' in FIG. 2A) that may also be connected to different reference voltages based on the objectives of a particular implementation and based on the respective conductivity types of the transistors. For example, objectives may include a desired voltage shift including one or more voltages, among others. As will be described in more detail below, it will be understood that the manner in which the bulk terminals are shown to be connected in the various examples illustrated herein (including the example of FIG. 2A) correspond to certain assumptions about the desired voltage shift and the transistor combination being employed in these examples. As will be set forth in more detail below, implementations involving other transistor combinations and/or desired values of voltage shift may also employ different connections for the bulk terminals than those shown in these figures (e.g., connections allow the bulk terminals to optionally connect to yet another reference voltage option, etc.).

Input stage 106 is also shown to include various switches of the set of switches 110 described above. Each of these is labeled with a unique number **110-*x***, where '*x*' represents different identifier numbers to differentiate the various switches. As shown, input stage 106 includes input node 116 to receive the single-ended input, as well as a first output node 204-1 and a second output node 204-2 that will carry the differential signal to comparator 102. As such, it is noted in FIG. 2A that the first and second output nodes 204-1 and 204-2 of input stage 106 correspond to (or are equivalent to) the nodes labeled in FIG. 1 as first and second inputs 104-1 and 104-2 of comparator 102.

As mentioned above, when manipulated by a controller such as controller 112, switches 110 may allow for various terminals of transistor 202-1 and transistor 202-2 (also referred to collectively as transistors 202) to be connected in a variety of different configurations. FIG. 2A illustrates this in more detail. Specifically, as shown, a switch 110-1 and a switch 110-2 may allow first node 206-1 to connect to either input node 116 (when switch 110-1 is closed and switch 110-2 is open) or first output node 204-1 (when switch 110-1 is open and switch 110-2 is closed). A switch 110-3 and a switch 110-4 may allow second node 206-2 to connect to either first reference node 118-1 (when switch 110-3 is closed and switch 110-4 is open) or second output node 204-2 (when switch 110-3 is open and switch 110-4 is closed). Similarly, a switch 110-5 and a switch 110-6 may allow third node 206-3 to connect to either second reference node 118-2 (when switch 110-5 is closed and switch 110-6 is open) or second output node 204-2 (when switch 110-5 is open and switch 110-6 is closed).

Voltages provided at first reference node 118-1 and second reference node 118-2 may be any suitable reference voltages as may serve a particular implementation. In some implementations, these reference voltages may be wider than the voltage range at which the input signal is provided (on input node 116) by at least a threshold voltage so as to ensure that, when the input signal is sampled, both transistors 202 are activated. For example, if the input voltage range expected on input node 116 is 1.0V-2.2V and transistors 202 each have a threshold voltage of 0.3V, first reference node 118-1 may provide a reference voltage of at least 2.5V and second reference node 118-2 may provide a reference voltage of no more than 0.7V.

As has been described, any transistor combination of two or more transistors 202 (transistors 202-1 and 202-2 in FIG. 2A) may be used in a given implementation of input stage 106. To illustrate, a dashed box around transistors 202-1 and 202-2 (as well as at least parts of nodes 206-1, 206-2, and 206-3) is drawn to represent a particular transistor combination 210 selected from a variety of potential combinations that will now be illustrated and described with reference to FIG. 2B, which shows illustrative transistor combinations that may be used in various implementations of input stage 106 in accordance with principles described herein.

Figure 2B:
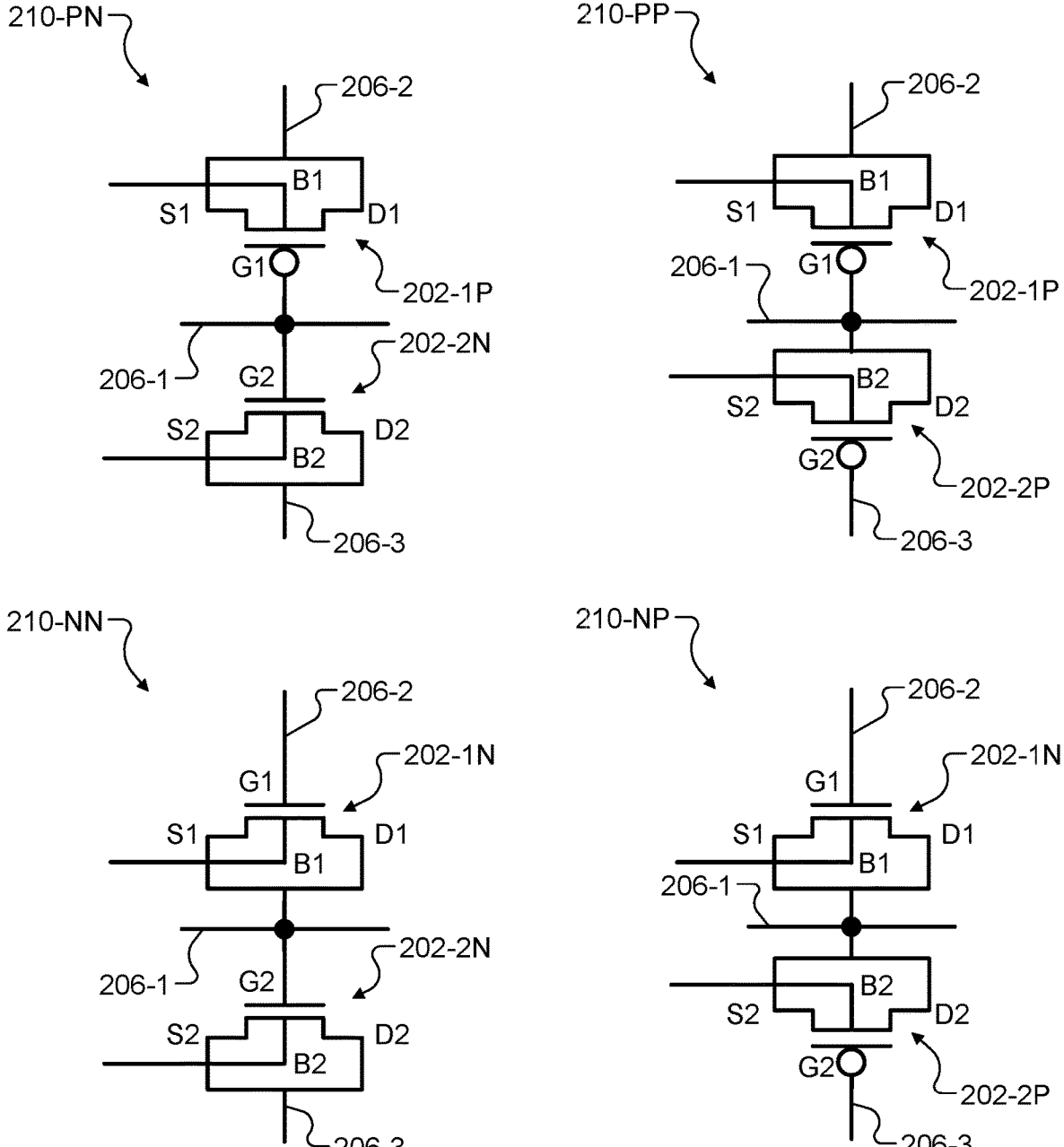
FIG. 2B shows illustrative combinations of transistors that may be used in an input stage of an analog-to-digital converter circuit in accordance with principles described herein.

As shown in FIG. 2B, four transistor combinations 210 are labeled using letters 'P' and/or 'N' to indicate which conductivity type is used for transistor 202-1 and for transistor 202-2. As mentioned above, a similar notation with 'P's and/or 'N's has been used to refer to, for example, PN combinations, PP combinations, and so forth. Each of these transistor combinations 210-PN (a PN combination), 210-PP (a PP combination), 210-NN (a NN combination), and NP (an NP combination) are illustrated in FIG. 2B and will now be described.

In transistor combination 210-PN, the conductivity type of transistor 202-1 is a P-type and the conductivity type of first transistor 202-2 is an N-type. As such, these transistors are drawn, respectively, as a PMOS transistor (labeled as transistor 202-1P) and as an NMOS transistor (labeled as transistor 202-2N). As shown in the example of transistor combination 210-PN, first transistor 202-1P is connected between first node 206-1 and second node 206-2 by a first gate (labeled 'G1') of first transistor 202-1P connecting to first node 206-1 and a first source (labeled 'S1') and a first drain (labeled 'D1') of first transistor 202-1P both connecting to second node 206-2. A bulk terminal of first transistor 202-1P is also shown (labeled 'B1') and will be described in more detail below. Second transistor 202-2N is shown to be connected between first node 206-1 and third node 206-3 by a second gate (labeled 'G2') of second transistor 202-2N connecting to first node 206-1 and a second source (labeled 'S2') and a second drain (labeled 'D2') of second transistor 202-2N both connecting to third node 206-3. A bulk terminal of second transistor 202-2N is also shown (labeled 'B2') and will be described in more detail below.

In transistor combination 210-PP, the conductivity type of both transistors 202-1 and 202-2 is a P-type. As such, these transistors are drawn, respectively, as PMOS transistors (labeled as transistors 202-1P and 202-2P). As shown in the example of transistor combination 210-PP, first transistor 202-1P is connected between first node 206-1 and second node 206-2 by a first gate (labeled 'G1') of first transistor 202-1P connecting to first node 206-1 and a first source (labeled 'S1') and a first drain (labeled 'D1') of first transistor 202-1P both connecting to second node 206-2. A bulk terminal of first transistor 202-1P is again shown (labeled 'B1') and will be described in more detail below. Second transistor 202-2P is shown to be connected between first node 206-1 and third node 206-3 by a second source (labeled 'S2') and a second drain (labeled 'D2') of second transistor 202-2P both connecting to first node 206-1 and a second gate (labeled 'G2') of second transistor 202-2P connecting to third node 206-3. A bulk terminal of second transistor 202-2P is also shown (labeled 'B2') and will be described in more detail below.

In transistor combination 210-NN, the conductivity type of both transistors 202-1 and 202-2 is an N-type. As such, these transistors are drawn, respectively, as NMOS transistors (labeled as transistors 202-1N and 202-2N). As shown in the example of transistor combination 210-NN, first transistor 202-1N is connected between first node 206-1 and second node 206-2 by a first source (labeled 'S1') and a first drain (labeled 'D1') of first transistor 202-1N both connecting to first node 206-1 and a first gate (labeled 'G1') of first transistor 202-1N connecting to second node 206-2. A bulk terminal of first transistor 202-1N is again shown (labeled 'B1') and will be described in more detail below. Second transistor 202-2N is shown to be connected between first node 206-1 and third node 206-3 by a second gate (labeled 'G2') of second transistor 202-2N connecting to first node 206-1 and a second source (labeled 'S2') and a second drain (labeled 'D2') of second transistor 202-2N both connecting to third node 206-3. A bulk terminal of second transistor 202-2N is also shown (labeled 'B2') and will be described in more detail below.

In transistor combination 210-NP, the conductivity type of transistor 202-1 is an N-type and the conductivity type of transistor 202-2 is a P-type. As such, these transistors are drawn, respectively, as an NMOS transistor (labeled as transistor 202-1N) and as a PMOS transistor (labeled as transistor 202-2P). As shown in the example of transistor combination 210-NP, first transistor 202-1N is connected between first node 206-1 and second node 206-2 by a first source (labeled 'S1') and a first drain (labeled 'D1') of first transistor 202-1N both connecting to first node 206-1 and a first gate (labeled 'G1') of first transistor 202-1N connecting to second node 206-2. A bulk terminal of first transistor 202-1N is again shown (labeled 'B1') and will be described in more detail below. Second transistor 202-2P is shown to be connected between first node 206-1 and third node 206-3 by a second source (labeled 'S2') and a second drain (labeled 'D2') of second transistor 202-2P both connecting to first node 206-1 and a second gate (labeled 'G2') of second transistor 202-2P connecting to third node 206-3. A bulk terminal of second transistor 202-2P is also shown (labeled 'B2') and will be described in more detail below.

Returning to FIG. 2A, along with the respective gate, source, and drain terminals described above, transistors 202 are also each shown to include the respective bulk terminals (also referred to as body terminals) that were mentioned above and that may also be reconfigurable based on certain switches of the set of switches 110. Specifically, as shown, first transistor 202-1 may have a first bulk terminal (labeled 'B1') and second transistor 202-2 may have a second bulk terminal (labeled 'B2'). The set of switches 110 is further configured, when manipulated by controller 112, to allow these bulk terminals to be connected in different configurations, though it will be understood that for sake of clarity and conciseness, certain configurations that could be desirable for certain circumstances (e.g., for transistor combinations other than the PN combination 210-PN in FIG. 2B, etc.) may not be achievable by the particular set of switches and connections illustrated in FIG. 2A and other figures below. For example, assuming a PN transistor combination such as illustrated by transistor combination 210-PN, FIG. 2A shows a switch 110-7 and a switch 110-8 that allow the first bulk terminal B1 to connect to either first reference node 118-1 (when switch 110-7 is closed and switch 110-8 is open) or a first shifted supply node 208-1 (when switch 110-7 is open and switch 110-8 is closed). Similarly, a switch 110-9 and a switch 110-10 may allow the second bulk terminal B2 to connect to either second reference node 118-2 (when switch 110-9 is closed and switch 110-10 is open) or a second shifted supply node 208-2 (when switch 110-9 is open and switch 110-10 is closed). Other connections (e.g., such as to other supply nodes rather than to reference nodes 118-1 and 118-2) through other switches not explicitly shown in FIG. 2A may be used to achieve an analogous voltage shift for transistor combinations other than the PN combination assumed for this example. For instance, if transistor 202-1 were to have N-type rather than P-type conductivity, a significantly lower bulk voltage than that provided at reference node 118-1 may be desirable. Accordingly, rather than switch 110-7 connecting the bulk terminal to reference node 118-1, this switch may optionally connect the bulk terminal to a lower voltage rail not explicitly shown in FIG. 2.

As will be described in more detail below, the bulk terminals and their associated switches 110 may be used to implement a voltage shift for signals on both output nodes 204-1 and 204-2 in implementations where such a shift is desirable for downstream circuitry (e.g., comparator 102, DAC feedback circuit 108, etc.). As such, voltages provided at first shifted supply node 208-1 and second shifted supply node 208-2, like those provided at first reference node 118-1 and second reference node 118-2, may be any suitable reference voltages as may serve a particular implementation. For example, if it is assumed that a PN transistor combination is used for transistors 202 and that downstream circuitry is configured to operate with a supply voltage (VDD) of 1.5V and a ground voltage of 0V, first shifted supply node 208-1 could be connected to VDD (1.5V), while second shifted supply node 208-2 could be connected to ground (0V). It will be understood that these values may be different for other transistor combinations and situations.

Figure 3:
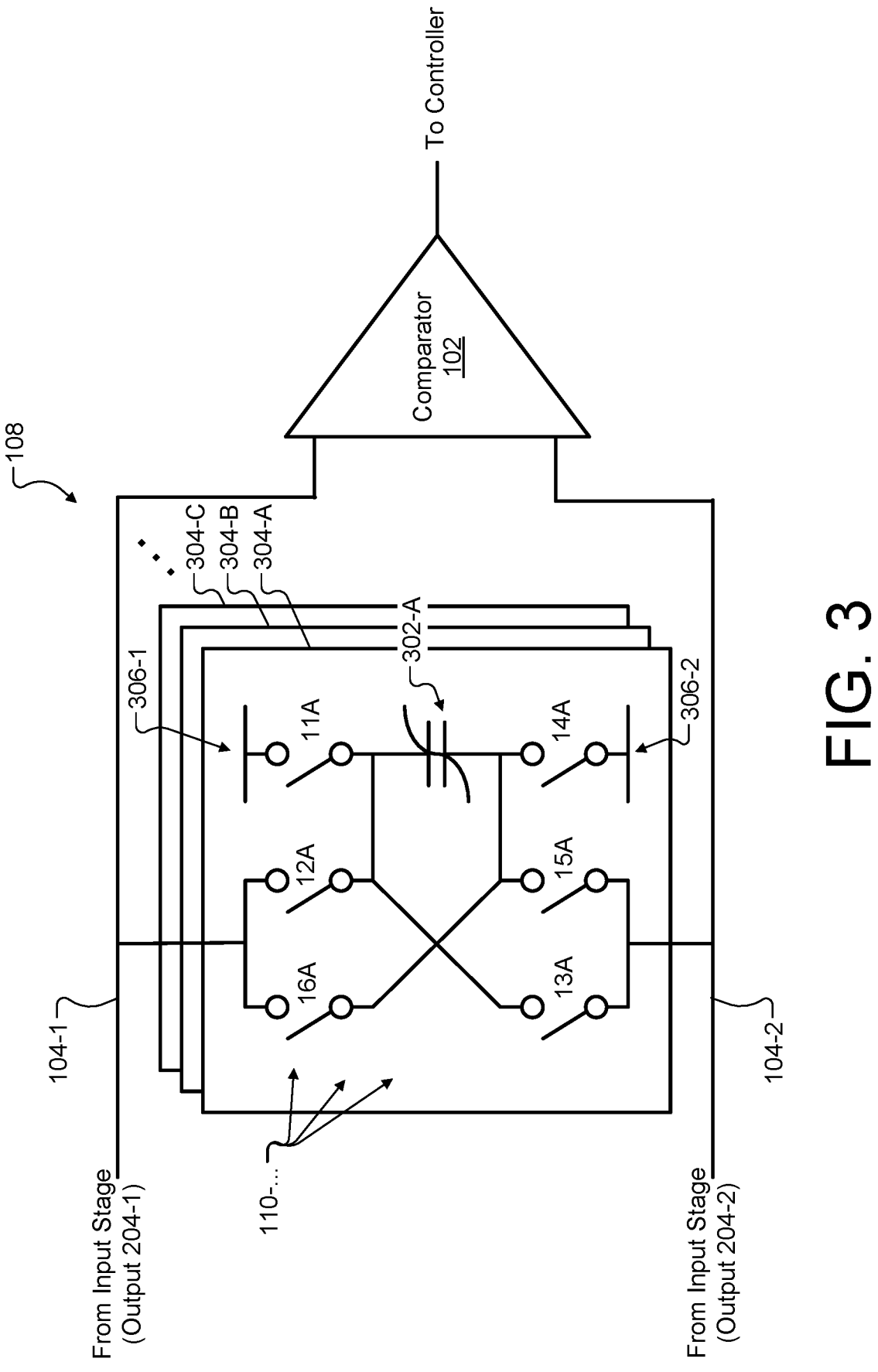
FIG. 3 shows an example schematic diagram of the digital-to-analog feedback circuit of the analog-to-digital converter circuit of FIG. 1 in accordance with principles described herein.

FIG. 3 shows an example schematic diagram of DAC feedback circuit 108 of ADC circuit 100, along with comparator 102. As mentioned above, DAC feedback circuit 108 may include a plurality of capacitors referred to herein as a series of successive-approximation capacitors. To illustrate this, FIG. 3 shows one successive-approximation capacitor 302-A included, along with various switches from the set of switches 110, within a first successive-approximation-register (SAR) stage 304-A. While not all explicitly shown, FIG. 3 illustrates that several additional SAR stages 304-B, 304-C, and others (as indicated by an ellipsis) similar to SAR stage 304-A may also be included. It will be understood that each of these SAR stages 304 may include its own successive-approximation capacitor and its own switches to perform a similar function as will be described for SAR stage 304-A. As such, the 'A' in the designators for the components shown in SAR stage 304-A is meant to indicate that these components may have similar counterparts (which, if shown, could be referred to with designators 'B', 'C', etc.) in each of the other SAR stages 304. Additionally, while space constraints in the figure do not allow for each switch 110 to be explicitly numbered as switch 110-x, the designator placed next to each switch ('11A', '12A', etc.) will be understood to differentiate that switch 110 from others and the switches will be referred to using their full designators (switches 110-11A, 110-12A, etc.).

DAC feedback circuit 108 is shown to be connected to inputs 104-1 and 104-2 of comparator 102, which, as described and illustrated in FIG. 2A (and as noted in FIG. 3), may be the same nodes as output nodes 204-1 and 204-2 of input stage 106. As will be described in more detail below, DAC feedback circuit 108 may be configured to precharge the series of successive-approximation capacitors 302 (i.e., successive-approximation capacitor 302-A and other successive-approximation capacitor included in the other SAR stages 304) while the input stage is in a sampling configuration or otherwise is not yet connected to DAC feedback circuit 108 and comparator 102. DAC feedback circuit 108 may then be configured (as directed by controller 112) to step through and connect each of the successive-approximation capacitors 302, with either a positive polarity or a negative polarity, between inputs 104-1 and 104-2 of comparator 102 during a conversion phase.

Accordingly, FIG. 3 shows how the set of switches 110 may be configured (when manipulated by controller 112) to allow each capacitor of the series of successive-approximation capacitors 302 to connect between a first precharge reference node 306-1 and a second precharge reference node 306-2. Specifically, as shown, when a switch 110-11A is closed (and when a switch 110-12A and a switch 110-13A are open), a first terminal of successive-approximation capacitor 302-A is connected to first precharge reference node 306-1, while when a switch 110-14A is closed (and when a switch 110-15A and a switch 110-16A are open), the other terminal of successive-approximation capacitor 302-A is connected to second precharge reference node 306-2. The reference voltage provided at precharge reference nodes 306-1 and 306-2 may be any suitable reference voltage. For example, the precharge reference voltage may be the same VDD and ground voltage mentioned above in connection with shifted supply nodes 208-1 and 208-2, or may be a version of that voltage (an isolated or cleaner version of the supply and ground voltages). As another example, the precharge reference voltage may be different from the VDD and ground supply voltages, such as a slightly wider voltage, a slightly narrower voltage, or the like, as may serve a particular implementation.

Once the successive-approximation capacitors are precharged (such as during a sampling phase and/or a voltage-shift phase) and a conversion phase is entered, controller 112 may manipulate switches 110 to successively connect and align each of the successive-approximation capacitors 302 between inputs 104-1 and 104-2 with either a positive polarity or a negative polarity so as to try to match the sampled charge (represented by the differential voltage put on inputs 104 by input stage 106) more and more closely. For example, as shown, successive-approximation capacitor 302-A may be connected between inputs 104-1 and 104-2 with a positive polarity when switches 110-12A and 110-15A are closed (and switches 110-11A, 110-13A, 110-14A, and 110-16A are open). Successive-approximation capacitor 302-A may be connected between inputs 104-1 and 104-2 with a negative polarity when switches 110-13A and 110-16A are closed (and switches 110-11A, 110-12A, 110-14A, and 110-15A are open).

Successive-approximation capacitors 302-A may be sized with different capacitances such that, when connected and aligned with respective polarities that bring the differential voltage on inputs 104-1 and 104-2 to a midrange value (which may occur when the charge held in the successive-approximation capacitors 302 approximately matched with the sampled charge in the transistor capacitance of transistors 202-1 and 202-2), the respective polarities of the various capacitors collectively create a digital value corresponding to the sampled charge. For example, each successive-approximation capacitor 302 in the series may be configured with half the capacitance of the capacitor preceding it and the polarity or alignment needed to approximately match the sampled charge may represent one significant digit of the digital output.

For an N-bit CS-SAR analog-to-digital converter circuit, DAC feedback circuit 108 may include N successive-approximation capacitors 302. As one example, a 10-bit CS-SAR analog-to-digital converter circuit may include ten capacitors. The N capacitors within DAC feedback circuit 108 may all be pre-charged to a known precharge reference voltage level (the reference voltage between precharge reference nodes 306-1 and 306-2) prior to the conversion phase, and selectively coupled to the inputs 104-1 and 104-2 in different polarities according to the amount of charge that was sampled by input stage 106.

In certain CS-SAR analog-to-digital converter circuits, the successive-approximation capacitors may be binary scaled so as to have a radix-2 sizing scheme. For example, an N-bit CS-SAR analog-to-digital converter circuit may include N successive-approximation capacitors with capacitance values $C$, $2C$, $4C$, $8C$, $16C$, . . . , $2^{N-1}C$. In other CS-SAR analog-to-digital converter circuits, the successive-approximation capacitors may instead by scaled using a sub-radix-2 sizing scheme in which, for any capacitor N with capacitance $C_N$, its capacitance $C_{N-1}$ is less than (rather than equal to) the sum of the capacitances of all smaller capacitors $C_{N-2}$, $C_{N-3}$, $C_{N-4}$, . . . , $C_0$. In other words, instead of a scaling factor of 2, a sub-radix-2 sizing scheme may use a scaling factor such as 1.9, 1.8, 1.7, 1.5-1.9999, or any other suitable scaling factor less than 2. For instance, using a scaling factor of 1.9, an N-bit CS-SAR analog-to-digital converter circuit may include N successive-approximation capacitors with capacitance values C, 1.90C, 3.61C ($1.9^2$C), 6.86C ($1.9^3$C), 13.0C ($1.9^4$C), and so forth.

Figure 4:
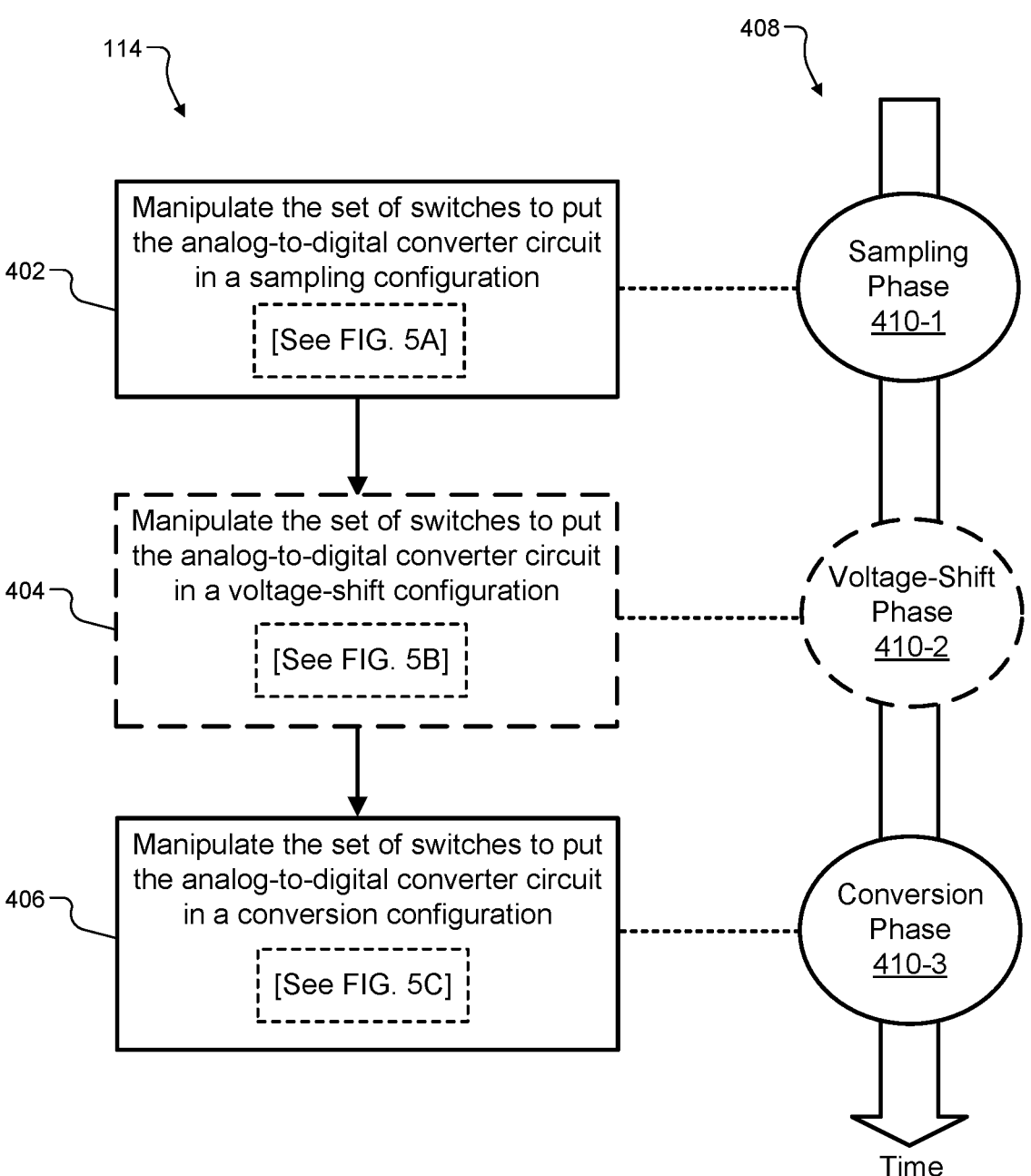
FIG. 4 shows an example method that may be performed in relation to the analog-to-digital converter circuit of FIG. 1 in accordance with principles described herein.

FIG. 4 shows an example implementation of method 114 described above in relation to FIG. 1 as being performed by controller 112 for ADC circuit 100. While FIG. 4 shows illustrative operations 402-406 according to one implementation, it will be understood that other implementations of method 114 may omit, add to, reorder, and/or modify any of the operations 402-406 shown in FIG. 4. In some examples, multiple operations shown in FIG. 4 or described in relation to FIG. 4 may be performed concurrently (e.g., in parallel) with one another, rather than being performed sequentially as illustrated and/or described. Each of operations 402-406 will now be described in more detail as they may be performed by an implementation of ADC circuit 100 or, more particularly, by an implementation of controller 112 that may be integrated with or implemented separately from ADC circuit 100. Operations 402-406 each include a dashed box referencing one of FIGS. 5A-5C, which will also be used to illustrate these operations. Alongside method 114, an analog-to-digital conversion procedure 408 associated with the method is shown to include several phases placed along a timeline going from the top of the page to the bottom ("Time"). In the following description, phases 410-1 through 410-3 will also be referred to in connection with their respective operations 402-406.

At operation 402, a controller may manipulate a set of switches to put an analog-to-digital converter circuit in a sampling configuration. As illustrated above, the analog-to-digital converter circuit described in this example will be assumed to include an input stage with a first transistor of a first conductivity type connected between a first node (first node 206-1) and a second node (second node 206-2) and a second transistor of a second conductivity type connected between the first node and a third node (third node 206-3). As shown, this sampling configuration may be associated with a sampling phase 410-1 that may be the first phase performed in time (prior to the other phases 410) in analog-to-digital conversion procedure 408. As mentioned above and as will be illustrated and described in connection with FIG. 5A, the set of switches may be manipulated for the sampling configuration such that: 1) the first node is connected to an input node and disconnected from a comparator, 2) the second node is connected to a first reference node and disconnected from the comparator, and 3) the third node is connected to a second reference node and disconnected from the comparator.

Figure 5A:
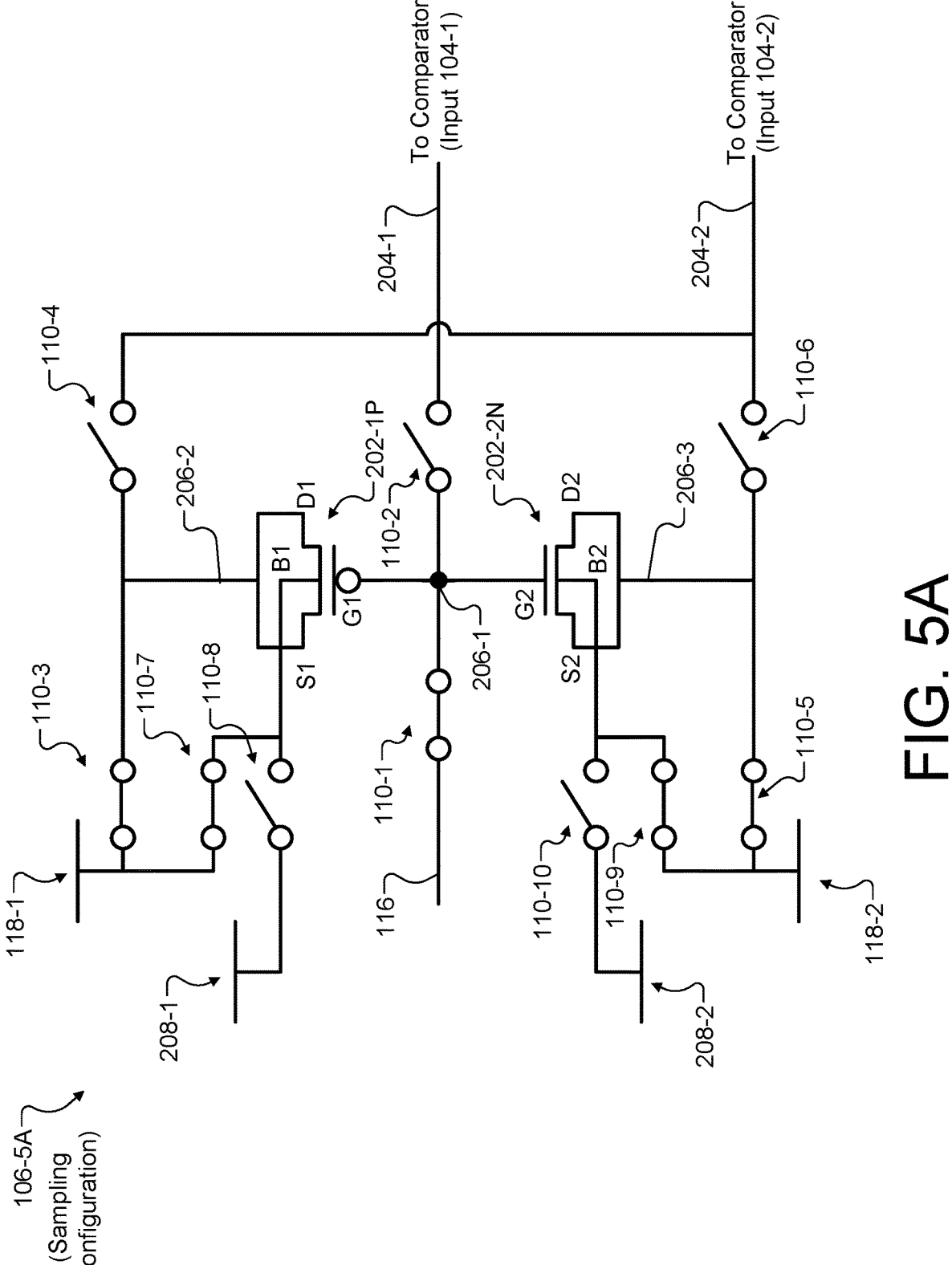
FIG. 5A shows a schematic diagram of an example sampling configuration of a single-ended analog-to-digital converter input stage with transistor-based capacitance in accordance with principles described herein.

To illustrate, FIG. 5A shows a schematic diagram of input stage 106 in a sampling configuration 106-5A. The same elements of input stage 106 are shown to be included in FIG. 5A as have been described above in relation to FIGS. 2A-2B. In particular, the elements of FIG. 2A are shown to be used with a PN transistor combination implemented with a first transistor 202-1P and a second transistor 202-2N (connected in the manner of transistor combination 210-PN in FIG. 2B). However, to illustrate the sampling configuration, certain switches 110 are now shown to be closed (while others remain open). Specifically, as shown, first node 206-1 (connecting gate G1 of transistor 202-1P and gate G2 of transistor 202-2N) is shown to be connected to input node 116 and to be disconnected from the comparator (disconnected from output node 204-1 going to comparator 102) by switch 110-1 being closed and by switch 110-2 being open. Second node 206-2 (connecting source S1 and drain D1 of transistor 202-1P) is shown to be connected to reference node 118-1 and to be disconnected from the comparator (disconnected from output node 204-2 going to comparator 102) by switch 110-3 being closed and by switch 110-4 being open. Third node 206-3 (connecting source S2 and drain D2 of transistor 202-2N) is shown to be connected to reference node 118-2 and to be disconnected from the comparator (disconnected from output node 204-2 going to comparator 102) by switch 110-5 being closed and by switch 110-6 being open. In this example, sampling configuration 106-5A further shows that bulk terminal B1 of transistor 202-1P may be connected to reference node 118-1 and disconnected from shifted supply node 208-1 by switch 110-7 being closed and by switch 110-8 being open. Bulk terminal B2 of transistor 202-2N is similarly connected to reference node 118-2 and disconnected from shifted supply node 208-2 by switch 110-9 being closed and by switch 110-10 being open.

In this sampling configuration, charge associated with a single-ended input signal received on input node 116 may be captured and stored in the capacitance of transistors 202. For example, the voltage between second node 206-2 (the same as reference node 118-1 in this configuration) and first node 206-1 may be greater than a threshold voltage of transistor 202-1P, such that transistor 202-1P may be activated and used as a capacitor (holding a charge between gate G1 on one side and source S1 and drain D1 on the other side). Similarly, and in a complementary manner characteristic of CMOS circuitry, the voltage between third node 206-3 (the same as reference node 118-2 in this configuration) and first node 206-1 may be greater than a threshold voltage of transistor 202-2N, such that transistor 202-2N may also be activated and used as another capacitor (holding a charge between gate G2 on one side and source S2 and drain D2 on the other side). Once the capacitance on these transistors 202 is charged by the single-ended input signal, sampling phase 410-1 may be complete and the sampled charge stored within this transistor-based capacitance will thereafter be conserved for use in the CS-SAR analog-to-digital converter circuit.

Returning to FIG. 4, at operation 404, the controller may manipulate the set of switches to put the analog-to-digital converter circuit in a voltage-shift configuration. As shown, this voltage-shift configuration may be associated with a voltage-shift phase 410-2. In some implementations, such as is shown in the example of FIG. 4, voltage-shift phase 410-2 may follow sampling phase 410-1 in time during analog-to-digital conversion procedure 408. In other implementations, it will be understood that the voltage-shift phase may not be a separate phase in time, but, rather, the reconnection of the transistor bulks may be performed at the same time (or near in time) to when connections are made for a conversion configuration described in more detail below. In other words, while shown as a separate phase in FIG. 4, it will be understood that voltage-shift phase 410-2 may be merged with conversion phase 410-3 in certain implementations. As mentioned above and as will be illustrated and described in connection with FIG. 5B, the set of switches may be manipulated for the voltage-shift configuration such that: 1) a first bulk terminal of the first transistor is connected to a first shifted supply node; 2) a second bulk terminal of the second transistor is connected to a second shifted supply node; 3) a first node to which both transistors are connected is floating disconnected from the input node and the first input of the comparator; 4) a second node to which the first transistor is connected is floating disconnected from both the first reference node and the second input of the comparator; and 5) a third node to which the second transistor is connected is floating disconnected from both the second reference node and the second input of the comparator.

Figure 5B:
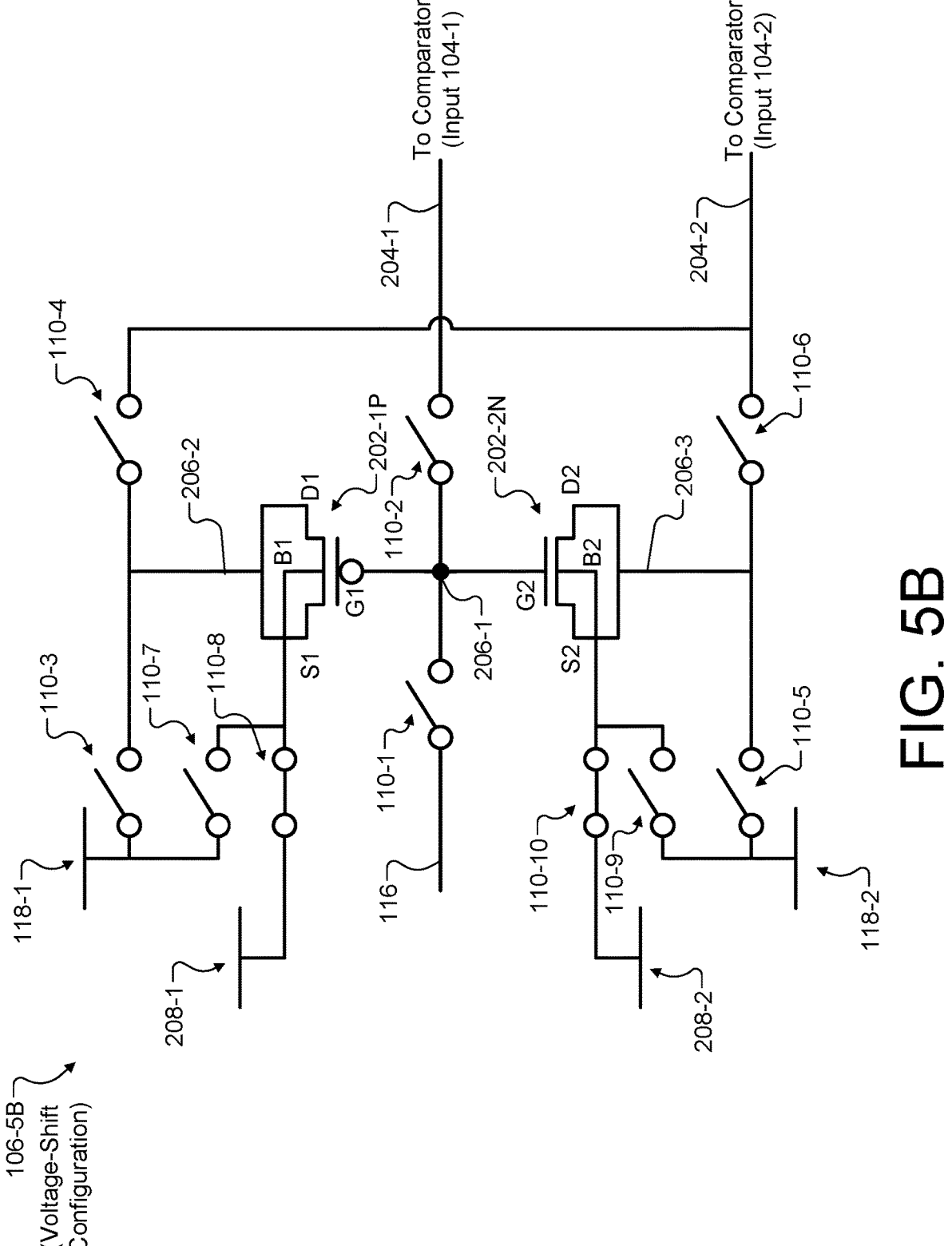
FIG. 5B shows a schematic diagram of an example voltage-shift configuration of the single-ended analog-to-digital converter input stage with transistor-based capacitance in accordance with principles described herein.

To illustrate, FIG. 5B shows a schematic diagram of input stage 106 in a voltage-shift configuration 106-5B. The same elements of input stage 106 are shown to be included in FIG. 5B as have been described and illustrated in other examples above. However, different switches 110 are now shown to be open and closed to illustrate the voltage-shift configuration. Specifically, as shown, bulk terminal B1 of first transistor 202-1P is shown to be connected to first shifted supply node 208-1 and to be disconnected from reference node 118-1 by switch 110-8 being closed and by switch 110-7 being open. Bulk terminal B2 of second transistor 202-2N is similarly shown to be connected to second shifted supply node 208-2 and to be disconnected from reference node 118-2 by switch 110-10 being closed and by switch 110-9 being open. Other terminals besides the bulk terminals are then shown in voltage-shift configuration 106-5B to be floating (disconnected from other parts of the circuit other than other terminals of the transistors as shown). Specifically, FIG. 5B shows that first node 206-1 is floating disconnected from both input node 116 and output node 204-1 (leading to input 104-1 of the comparator) by switches 110-1 and 110-2 both being open. Second node 206-2 is similarly shown to be floating disconnected from both first reference node 118-1 and second output node 204-2 (leading to input 104-2 of the comparator) by switches 110-3 and 110-4 both being open. Third node 206-3 is also shown to be floating disconnected from both second reference node 118-2 and second output node 204-2 (leading to input 104-2 of the comparator) by switches 110-5 and 110-6 both being open.

In this voltage-shift configuration, the voltage associated with the charge sampled and stored by transistors 202 during the sampling phase may be quickly and passively shifted as the terminals of these transistors (other than the bulk terminals) are floating. As indicated by dashed lines outlining operation 404 and voltage-shift phase 410-2 in FIG. 4, this operation/phase may be understood to be optional and used only in implementations where such a voltage shift is desirable. For example, as mentioned above, an image sensor application may typically use a different voltage range where pixels are sampling light and where digital data is being converted and read out. In one particular implementation, for instance, it may be desirable to shift an input voltage from being in a voltage domain with a range between 0.7V-2.5V to be processed in a voltage domain with a range between 0.0V-1.2V.

To describe how this type of passive, downward voltage shift may be achieved, it will be understood that transistors 202 do not only have the gate capacitance described above as being between the gate on one side and the source and drain on the other side (also referred to herein as a MOS capacitance). While the gate, source, and drain terminals are all floating in this configuration, transistors 202 may each further have a bulk capacitance that is not floating but, rather is connected to the respective shifted supply nodes 208-1 and 208-2. In voltage-shift phase 410-2, this bulk capacitance may be used to shift the voltages on the otherwise floating transistors to the voltage range framed by the voltages on shifted supply nodes 208-1 and 208-2. Specifically, due to capacitive coupling with the bulk capacitance, the voltages on these floating nodes will follow the bulk or body of transistors 202 to be centered within the desired voltage range. Alternatively, if no voltage shift is desired for a given implementation, this phase may be dispensed with, and the bulk terminals may be unconnected or may remain connected to respective reference nodes 118-1 and 118-2 (eliminating the need for switches 110-7 through 110-10).

Figure 5C:
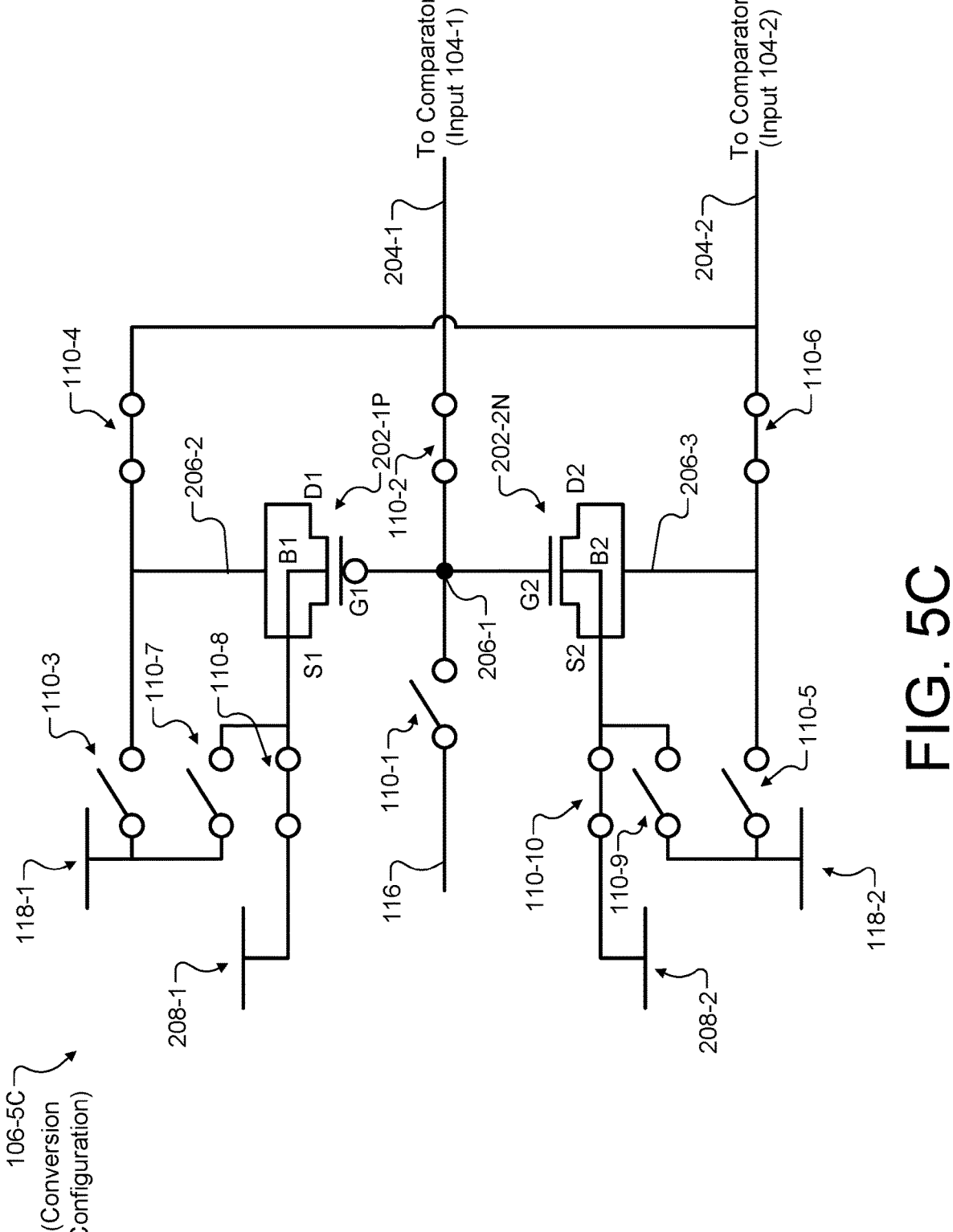
FIG. 5C shows a schematic diagram of an example conversion configuration of the single-ended analog-to-digital converter input stage with transistor-based capacitance in accordance with principles described herein.

It will also be understood that a similar or the same effect as described above in relation to the voltage-shift configuration may be achieved by connecting the bulk terminals in the manner described while then immediately connecting the first node to the first output node (rather than letting it float disconnected from any other node) and connecting the second and third nodes to the second output node (rather than letting them float disconnected from any other node) in the manner described herein for the conversion configuration (see, e.g., the description of FIG. 5C below). In other words, if a voltage shift is desired, this shift may be achieved by properly connecting the bulk terminals and then by either allowing the transistors to float as the voltage shifts or immediately connecting them in the conversion configuration without an explicit period of time where the transistors float disconnected.

Returning to FIG. 4, at operation 406, the controller may manipulate the set of switches to put the analog-to-digital converter circuit in a conversion configuration. As shown, this conversion configuration may be associated with a conversion phase 410-3 that may follow sampling phase 410-1 and voltage-shift phase 410-2 in time during analog-to-digital conversion procedure 408. In some examples, as mentioned above, voltage-shift phase 410-2 may be implemented concurrently (simultaneously, partially overlapping, etc.) with conversion phase 410-3. As mentioned above and as will be illustrated and described in connection with FIG. 5C, the set of switches may be manipulated for the conversion configuration such that: 1) the first node is disconnected from the input node and connected to a first input of the comparator, 2) the second node is disconnected from the first reference node and connected to a second input of the comparator, and 3) the third node is disconnected from the second reference node and connected to the second input of the comparator.

To illustrate, FIG. 5C shows a schematic diagram of input stage 106 in a conversion configuration 106-5C. The same elements of input stage 106 are shown to be included in FIG. 5C as have been described and illustrated in other examples above. However, different switches 110 are now shown to be open and closed to illustrate the conversion configuration. Specifically, as shown, first node 206-1 (connecting gate G1 of transistor 202-1P and gate G2 of transistor 202-2N) is shown to be connected to first output node 204-1 (to go to input 104-1 of the comparator) and to be disconnected from input node 116 by switch 110-1 now being open while switch 110-2 is closed. Second node 206-2 (connecting source S1 and drain D1 of transistor 202-1P) is shown to be connected at source-drain node 206-SD1) to output node 204-2 (to go to input 104-2 of the comparator) and to be disconnected from reference node 118-1 by switch 110-3 now being open while switch 110-4 is closed. Third node 206-3 (connecting source S2 and drain D2 of transistor 202-2N) is also shown to be connected to output node 204-2 (to go to input 104-2 of the comparator) and to be disconnected from reference node 118-2 by switch 110-5 now being open while switch 110-6 is closed. In this example, sampling configuration 106-5C further shows that bulk terminal B1 of transistor 202-1P continues to be connected to shifted supply node 208-1 and disconnected from reference node 118-1 (as was the case in voltage-shift configuration 106-5B, assuming an example implementation that uses the optional voltage-shift phase) by switch 110-7 being open and by switch 110-8 being closed. Likewise, bulk terminal B2 of transistor 202-2N is shown to still be connected to shifted supply node 208-2 and disconnected from reference node 118-2 by switch 110-9 being open and by switch 110-10 being closed.

In this conversion configuration, the voltage associated with the charge that was sampled and stored by transistors 202 during the sampling phase (and that may have been shifted during the voltage-shift phase) is now connected to output nodes 204-1 and 204-2 so as to be presented at inputs 104-1 and 104-2 of comparator 102. More particularly, FIG. 5C shows that in the conversion configuration, the set of switches 110 may be manipulated such that: 1) the first gate and the second gate are both connected to first input 104-1 of the comparator (and disconnected from the input node); 2) the first source and the first drain are both connected to second input 104-2 of the comparator (and disconnected from the first reference node); and 3) the second source and the second drain are both connected to second input 104-2 of the comparator (and disconnected from the second reference node).

By the time the switches are manipulated in this way, it is noted the input charge has been sampled and is stored in the MOS capacitance of transistor 202-1P and/or transistor 202-2N (or whatever transistor combination is used in a particular implementation). Accordingly, when second node 206-2 and third node 206-3 are suddenly connected at second output node 204-2 (so as to both feed into comparator input 104-2), the stored charge is conserved and, due to the capacitance between output node 204-1 (now connected to first node 206-1) on one side and output node 204-2 (now connected to second node 206-2 and third node 206-3) on the other side, a differential signal is generated between output nodes 204-1 and 204-2. As will now be illustrated and described in more detail in relation to FIG. 6, this differential signal arises automatically during the conversion phase based on the charge sampled during the sampling phase. More particularly, based on a sampled charge conserved within a capacitance between output nodes 204-1 and 204-2 when ADC circuit 100 is in the conversion configuration (the MOS capacitance of transistors 202), a differential signal corresponding to the sampled charge is generated on output nodes 204-1 and 204-2 and this differential signal is received by inputs 104-1 and 104-2 of comparator 102. As described above, certain analog-to-digital converter circuits, including CS-SAR analog-to-digital converter circuits described herein, may function based on a differential signal. Accordingly, this fast and passive way of generating a differential input signal without an additional differential conversion stage or pre-amplification circuit is highly efficient and may provide various advantages (relating to power usage, area, speed, etc.) as have been described.

While FIGS. 5A-5C illustrated specifically how some certain switches of the set of switches 110 may be manipulated during the different phases of analog-to-digital conversion procedure 408, it has been shown that additional switches 110, which may also be manipulated by controller 112 in different ways throughout analog-to-digital conversion procedure 408, are also implemented within DAC feedback circuit 108 (see, for example, switches 110-11A through 110-16A in FIG. 3). It will be understood that these additional switches may be manipulated such that successive-approximation capacitors 302 may be precharged prior to the conversion phase 410-3 (e.g., during sampling phase 410-1 and/or voltage-shift phase 410-2), and such that the capacitors 302 may successively be added between comparator inputs during the course of conversion phase 410-3. By the end of conversion phase 410-3, each capacitor 302 of the series of successive approximation capacitors may be connected with either the positive polarity or the negative polarity between first input 104-1 and second input 104-2 of comparator 102 so as to inversely match the sampled charge captured by input stage 106 when ADC circuit 100 was in the sampling configuration prior to being put in the conversion configuration.

Figure 6:
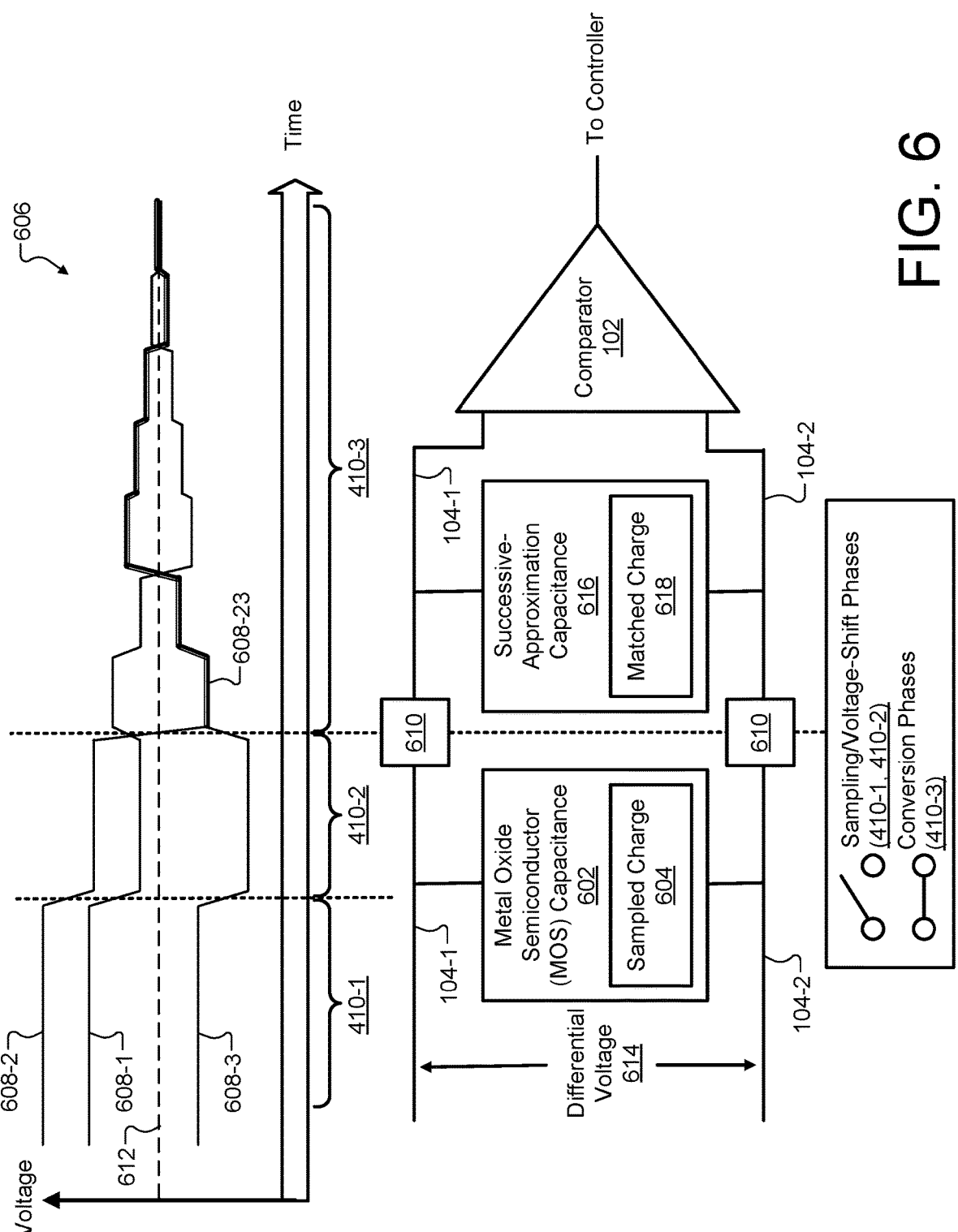
FIG. 6 shows illustrative aspects of how an input stage and a digital-to-analog feedback circuit may interoperate during various phases of an analog-to-digital conversion procedure in accordance with principles described herein.

To illustrate, FIG. 6 shows certain aspects of how input stage 106 and DAC feedback circuit 108 may interoperate during various phases of the analog-to-digital conversion procedure 408 described above. Certain principles now described arise from ADC circuit 100 implementing a CS-SAR analog-to-digital converter that operates in a charge domain instead of a voltage domain. Other aspects arise from the unique use of CMOS-based capacitance in the single-ended input stage described and illustrated above.

As shown in FIG. 6, a MOS capacitance 602 provided by the CMOS transistors in input stage 106 may capture and store a sampled charge 604 between the inputs 104-1 and 104-2 of comparator 102. This sampling of the input to capture sampled charge 604 may be performed during sampling phase 410-1, as has been described. A graph 606 including a set of waveforms to show the voltage on various nodes during the phases 410 of procedure 408 illustrates this sampling phase 410-1 near the left of the graph. Specifically, a waveform 608-1 will be understood to correspond to the voltage (on the y-axis), with respect to time (on the x-axis), during phases 410 on first node 206-1. Similarly, a waveform 608-2 will be understood to correspond to the voltage on second node 206-2, while a waveform 608-3 will be understood to correspond to the voltage on third node 206-3.

During sampling phase 410-1, graph 606 shows that waveform 608-2 (attached to the source and drain of first transistor 202-1P and to reference node 118-1, as shown in FIG. 5A) has a voltage higher than the voltage of waveform 608-1 (attached to the gates of both transistors 202 and to input node 116, as further shown in FIG. 5A), which itself is higher than the voltage of waveform 608-3 (attached to the source and drain of second transistor 202-2N and to reference node 118-2, as further shown in FIG. 5A). As has been described, the single-ended input signal coming in on input node 116 may charge up MOS capacitance 602 during this sampling phase 410-1 such that whatever sampled charge 604 is captured during this phase will be conserved thereafter.

During voltage-shift phase 410-2, graph 606 shows that all three waveforms 608-1, 608-2, and 608-3 shift downward in voltage as the source, drain, and gate terminals of both transistors 202 are made to float while the bulk terminals are connected to the shifted supply nodes 208-1 and 208-2 (as was illustrated and described in relation to FIG. 5B). The waveforms still have a similar relationship to one another during this phase, but their voltage domain is shown to be shifted to a lower range of voltages, such as a range in which DAC feedback circuit 108 and comparator 102 are configured to operate.

When moving from voltage-shift phase 410-2 to conversion phase 410-3, FIG. 5C illustrated that new connections were made between input stage 106 and the downstream circuitry of DAC feedback circuit 108 and comparator 102. These connections, which in FIG. 5C were made based on the closing of switches 110-2, 110-4, and 110-6, are represented in FIG. 6 as connections 610 on inputs 104-1 and 104-2. As shown in the key below the circuit diagram in FIG. 6, connections 610 will be understood to be disconnected during sampling phase 410-1 and voltage-shift phase 410-2 (illustrated by an open switch) and to be connected during conversion phase 410-3 (illustrated by a closed switch).

When connections 610 are made at the commencement of conversion phase 410-3, graph 606 shows that waveforms 608-2 and 608-3 merge to form a single circuit node (the same node as input 104-2). As shown, waveform 608-2 drops and waveform 608-3 raises to meet closer to a midscale voltage 612. Once combined at the start of conversion phase 410-3, graph 606 illustrates these two waveforms 608-2 and 608-3 as one waveform 608-23 that is drawn with a thicker line throughout the rest of conversion phase 410-3. As described above, the connection of nodes 206-2 and 206-3 at the start of conversion phase 410-3 does not cause waveforms 608-2 and 608-3 to meet at a midscale voltage 612 due to charge held by transistors 202. Instead, as shown, these devices cause waveforms 608-1 and 608-23 to form a differential signal around midscale voltage 612. A differential voltage 614 between inputs 104-1 and 104-2 is therefore shown to be present after this point.

With MOS capacitance 602 and its sampled charge 604 now connected to a successive-approximation capacitance 616 (provided by the various successive-approximation capacitors 302, as described above), comparator 102 and controller 112 may be configured to try to reduce differential voltage 614 as much as possible, thereby bringing waveforms 608-1 and 608-23 closer and closer to midscale voltage 612 with the addition of each new capacitor stage. As mentioned above, this is done by using comparator 102 to determine which polarity (positive or negative) is to be employed for each precharged capacitor in the series of successive-approximation capacitors. Accordingly, as shown in graph 606, the differential signal created by waveforms 608-1 and 608-23 grows closer and closer to midscale voltage 612 in steps that each represent an addition of another properly aligned successive-approximation capacitor 302 to the overall successive-approximation capacitance 616. As matched charge 618 gets close to actually matching sampled charge 604, this differential signal approaches midscale voltage 612 and controller 112 may determine (based on the polarities that have been used to accomplish this) a digital value corresponding to the sampled input.

As has been mentioned, an additional benefit may arise from the use of transistor-based capacitance (such as MOS capacitance 602) rather than a permanent type of capacitance that would be provided by an ordinary capacitor. Specifically, if the set of switches is manipulated to put the analog-to-digital converter circuit in the conversion configuration during a conversion phase, then: 1) at least one of the first transistor or the second transistor may be activated at a first time during the conversion phase, such that MOS capacitance 602 is enabled for use in storing the sampled charge 604 that was captured during a sampling phase prior to the first time; and 2) both the first transistor and the second transistor may be deactivated at a second time during the conversion phase, such that MOS capacitance 602 is disabled and a corresponding voltage boost is applied between the first output node (now connected to input 104-1) and the second output node (now connected to input 104-2) as sampled charge 604 is conserved. In other words, for example, as conversion phase 410-3 proceeds and differential voltage 614 decreases around midscale voltage 612, there may become a point where both transistor 202-1P and transistor 202-2N are deactivated due to their threshold voltages no longer being met. At this point, the transistors shut off and the transistor capacitance they provide (MOS capacitance 602) may be eliminated or significantly reduced. While the objective is for the controller to ultimately to cause the signal to decrease around the midscale voltage 612 as closely as possible, it will be understood that the differential voltage 614 may not decrease monotonically but may also have periods of temporary increase when certain new capacitors are added. Accordingly, transistors 202 may become deactivated and provide the voltage boost at one time during the conversion phase and become reactivated at a later time during the conversion phase.

Because charge is conserved, this reduction in capacitance in the circuit leads to a voltage boost in differential voltage 614 that is inversely proportional to the reduction in capacitance of MOS capacitance 602, as modeled by the capacitance equation $V=Q/C$ (where Q represents the charge being conserved, C represents the reduction in capacitance, and V represents the boost in voltage). Because ADC circuit 100 operates in the charge domain rather than the voltage domain, the total amount of charge being progressively distributed between MOS capacitance 602 and successive-approximation capacitance 616 is unaffected by this voltage boost, while the increase on differential voltage 614 helps make ADC circuit 100 less sensitive to noise, such as electrical noise originating in comparator 102, as differential voltage 614 becomes more and more attenuated toward the latter part of conversion phase 410-3.

Once matched charge 618 approximates sampled charge 604 to a suitable degree (e.g., based on the number of successive-approximation capacitors in the series, the amount of noise, etc.), the polarities of the successive-approximation capacitors may be used to represent a digital value corresponding to the original input signal. As such, the controller may output this digital value as digital output 120 and proceed back to the beginning of analog-to-digital conversion procedure 408 with a sampling phase 410-1 for the next value (not explicitly shown in FIG. 6).

An analog-to-digital converter circuit with a single-ended input stage with CMOS-based capacitance, such as any of the implementations of ADC circuit 100 that have been described and illustrated herein, may be used in a variety of applications and use cases where analog-to-digital conversion is performed. As one particular example, such analog-to-digital converter circuits may be implemented as part of an image readout circuit included within an image sensor integrated circuit (IC). For example, an input stage of the analog-to-digital converter circuit may be associated with a particular column of a plurality of columns within the image sensor IC, and the input stage may receive, at the input node, a single-ended column readout signal for the particular column. In some examples, the manipulating of the set of switches to put the analog-to-digital converter circuit in the sampling configuration and/or in the conversion configuration are performed as steps of an image readout procedure performed by the image readout circuit.

Figure 7A:
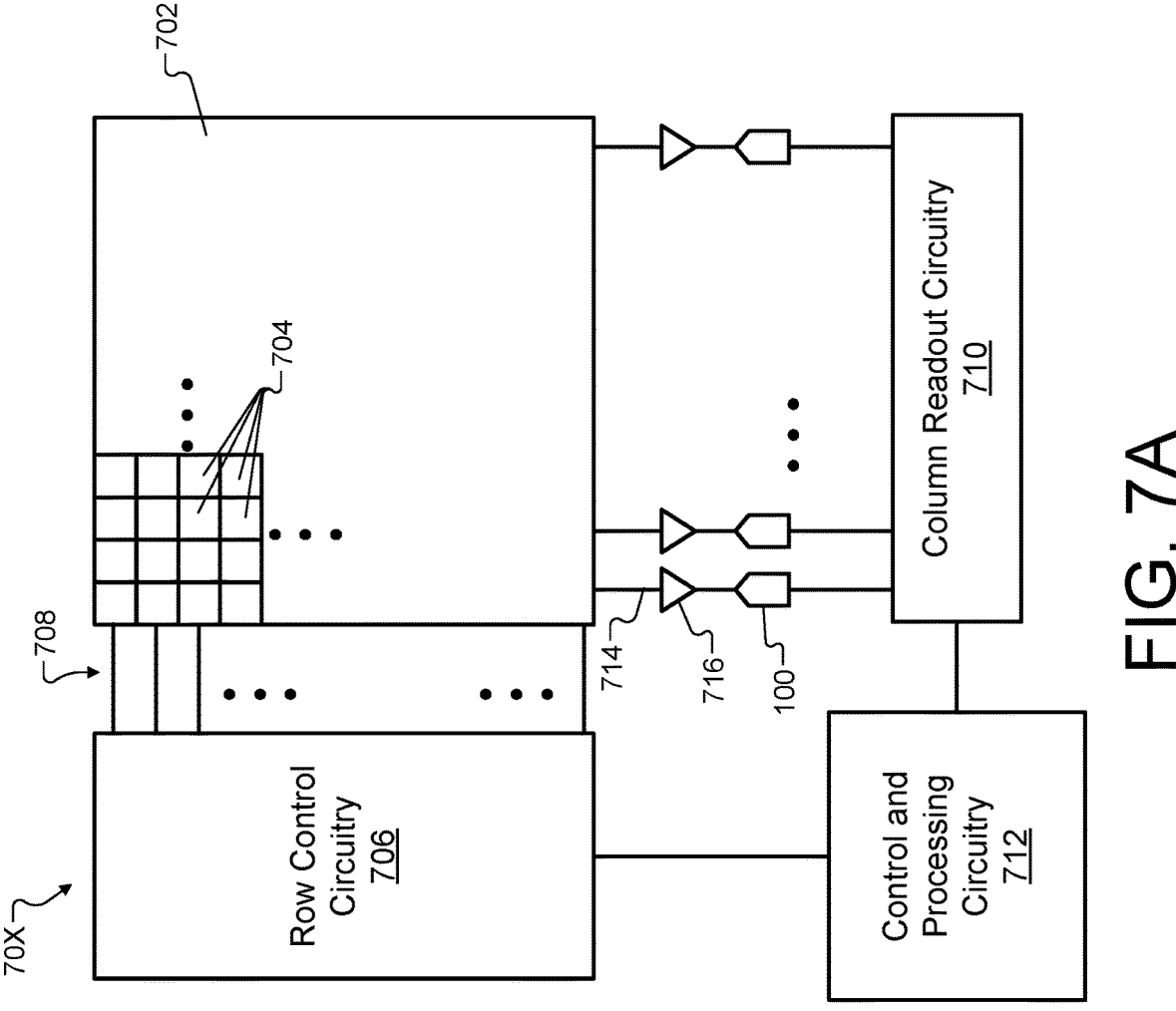
FIG. 7A shows certain aspects of an illustrative image sensor integrated circuit within which implementations of analog-to-digital converter circuitry described herein may be included in accordance with principles described herein.
Figure 7A:

To illustrate, FIG. 7A shows certain aspects of an illustrative image sensor integrated circuit (IC) 700 within which one or more implementations of analog-to-digital converter circuitry described herein (such as implementations of ADC circuit 100) may be included in accordance with principles described herein. It will be understood that, while certain implementations of analog-to-digital converter circuits described herein may relate to image sensors such as implemented by image sensor IC 700, other implementations may be practiced in other contexts and/or without some or all of these particular details.

As shown in FIG. 7A, image sensor IC 700 may include a pixel array 702 having multiple pixels 704 (sometimes referred to herein as image pixels 704 or image sensor pixels 704) and row control circuitry 706 that is coupled to image pixel array 702. Row control circuitry 706 may provide pixel control signals (e.g., row select signals, pixel reset signals, charge transfer signals, etc.) to pixels 704 over corresponding row control lines 708 to control the capture and read out of images using image sensor pixels in pixel array 702.

Image sensor IC 700 may include column readout circuitry 710 and control and processing circuitry 712 that is coupled to row control circuitry 706 and column readout circuitry 710. Column readout circuitry 710 may be coupled to pixel array 702 via multiple column lines 714. For example, each column of pixels 704 in pixel array 702 may be coupled to a respective column line 714. A corresponding analog-to-digital converter circuit 100 and (optional) column amplifier 716 may be interposed on each column line 714 for amplifying analog signals captured by pixel array 702 and converting the captured analog signals to corresponding digital pixel data. Column readout circuitry 710 may be coupled to external hardware such as control and processing circuitry 712. Column readout circuitry 710 may perform column readout based on signals received from control and processing circuitry 712. Column readout circuitry 710 may incorporate or be communicatively coupled to column ADC circuits 100 and/or column amplifiers 716.

Column amplifiers 716 may be configured to receive analog signals (e.g., analog reset or image level signals) from pixel array 702 and to amplify the analog signals as may serve a particular implementation. Due to various features described herein for single-ended input stages with transistor-based capacitance that may be incorporated in ADC circuit 100, column amplifiers 716 may be dispensed with or simplified in certain implementations. For example, certain tasks that might normally be performed by a pre-amplifier stage such as provided by column amplifiers 716 may be performed within ADC circuits 100, such as by input stages described herein. As a few examples that have been described, the input stage may be responsible for performing a voltage shift and/or a single-ended-to-differential conversion for the analog signals. The analog signals may include data from a single column of pixels or from multiple columns of pixels, depending on the application. ADC circuits 100 may receive amplified analog signals from amplifiers 716 and may perform analog-to-digital conversion operations on the analog signals to generate digital data. The digital data may be transmitted to column readout circuitry 710 for processing and readout.

Pixel array 702 may have any number of rows and columns. In general, the size of pixel array 702 and the number of rows and columns in pixel array 702 will depend on the particular implementation of image sensor IC 700. While rows and columns are generally described herein as being horizontal and vertical, respectively, rows and columns may refer to any grid-like structure (e.g., features described herein as rows may be arranged vertically and features described herein as columns may be arranged horizontally).

In FIG. 7A, each column is illustrated as including a dedicated column line 714, a dedicated column amplifier 716, and a dedicated ADC circuit 100 for that particular column. Various advantages may arise from each column having dedicated resources in accordance with this type of implementation, when such resources are available. In certain implementations in which area or other resources are budgeted tightly, however, it may be desirable for multiple columns to share access to certain resources, such as certain aspects of the ADC circuit 100. For example, a particular analog-to-digital converter circuit may implement a plurality of input stages that share parallel access to a singular comparator (comparator 102) and a singular digital-to-analog feedback circuit (DAC feedback circuit 108) of the analog-to-digital converter circuit. In this type of implementation, sampling and conversion operations may be staggered or pipelined across columns so as to share these resources more efficiently and thereby conserve area within image sensor IC 700.

Figure 7B:
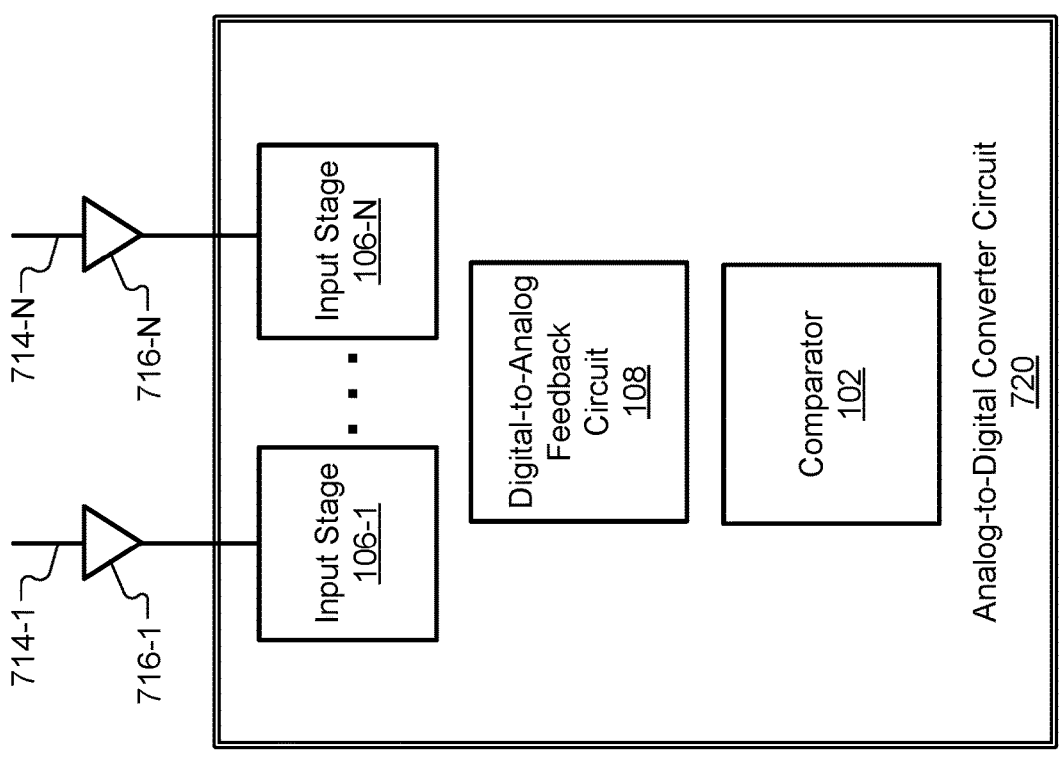
FIGS. 7B and 7C show certain aspects of an illustrative analog-to-digital converter circuit implementation that includes a plurality of input stages sharing access to a digital-to-analog feedback circuit and a comparator in accordance with principles described herein.
Figure 7C:
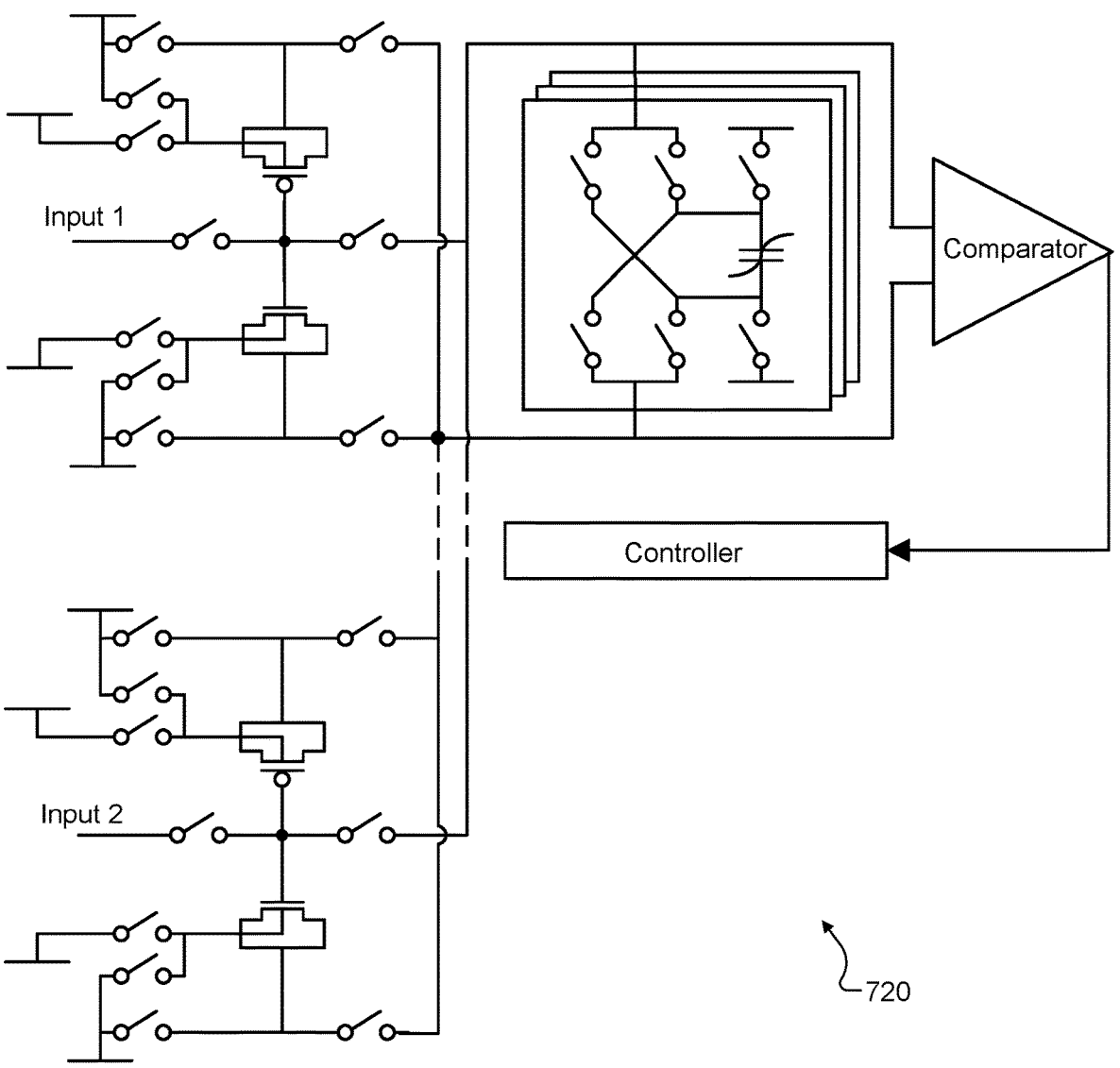

To illustrate, FIGS. 7B and 7C show certain aspects of an illustrative analog-to-digital converter circuit 720 that will be understood to be an implementation of ADC circuit 100 that includes a plurality of input stages 106-1 through 106-N (where N is any suitable integer 2 or greater) that each receive respective analog signals through their own column lines 714-1 through 714-N and (optional) column amplifiers 716-1 through 716-N. As shown in FIG. 7B, this plurality of input stages 106-1 through 106-N may share access to a singular DAC feedback circuit 108 and a singular comparator 102 in this type of implementation. FIG. 7C shows an example schematic diagram of illustrative analog-to-digital converter circuit 720 that includes the same inputs, outputs, and components (e.g., the set of switches, transistors, successive-approximation capacitors, etc.) as have been described in other examples above. In this example, the controller may be configured to further drive the switches to pipeline the various phases of analog-to-digital conversion procedure 408 such that the plurality of input stages 106 may share use of the DAC feedback circuit 108 and the comparator 102.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite illustrative relationships described in the specification or shown in the figures.

The various apparatus and techniques described herein may be implemented using various semiconductor processing and/or packaging techniques. Some embodiments may be implemented using various types of semiconductor processing technologies associated with semiconductor substrates including, but not limited to, for example, Silicon (Si), Gallium Arsenide (GaAs), Silicon Carbide (SiC), and/or so forth.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

It will be understood that, although the terms first, second, etc. may be used herein to describe various elements, these elements should not be limited by these terms. These terms are only used to distinguish one element from another. A first element could be termed a second element, and, similarly, a second element could be termed a first element, without departing from the scope of the implementations of the disclosure. As used herein, the term and/or includes any and all combinations of one or more of the associated listed items.

While certain features of the described implementations have been illustrated as described herein, many modifications, substitutions, changes, and equivalents may occur to those skilled in the art. It is therefore to be understood that the appended claims are intended to cover such modifications and changes as fall within the scope of the implementations. It will be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described. As such, the scope of the present disclosure is not limited to the particular combinations hereafter claimed, but instead extends to encompass any combination of features or example implementations described herein irrespective of whether or not that particular combination has been specifically enumerated in the accompanying claims at this time.

What is claimed is:

1. An input stage for an analog-to-digital converter circuit, the input stage comprising:

a first transistor of a first conductivity type, the first transistor being connected between a first node and a second node;

a second transistor of a second conductivity type, the second transistor being connected between the first node and a third node; and a set of switches configured, when manipulated by a controller, to connect:

the first node to an input node in a first configuration and to a first output node in a second configuration, the second node to a first reference node in the first configuration and to a second output node in the second configuration, and the third node to a second reference node in the first configuration and to the second output node in the second configuration.

2. The input stage of claim 1, wherein:

the first conductivity type is a P-type and the second conductivity type is an N-type;

the first transistor is connected between the first node and the second node by a first gate of the first transistor connecting to the first node and a first source and a first drain of the first transistor both connecting to the second node; and the second transistor is connected between the first node and the third node by a second gate of the second transistor connecting to the first node and a second source and a second drain of the second transistor both connecting to the third node.

3. The input stage of claim 1, wherein:

the first conductivity type and the second conductivity type are both P-type;

the first transistor is connected between the first node and the second node by a first gate of the first transistor connecting to the first node and a first source and a first drain of the first transistor both connecting to the second node; and the second transistor is connected between the first node and the third node by a second source and a second drain of the second transistor both connecting to the first node and a second gate of the second transistor connecting to the third node.

4. The input stage of claim 1, wherein:

the first conductivity type is an N-type and the second conductivity type is a P-type;

the first transistor is connected between the first node and the second node by a first source and a first drain of the first transistor both connecting to the first node and a first gate of the first transistor connecting to the second node; and the second transistor is connected between the first node and the third node by a second source and a second drain of the second transistor both connecting to the first node and a second gate of the second transistor connecting to the third node.

5. The input stage of claim 1, wherein:

the first conductivity type and the second conductivity type are both an N-type;

the first transistor is connected between the first node and the second node by a first source and a first drain of the first transistor both connecting to the first node and a first gate of the first transistor connecting to the second node; and the second transistor is connected between the first node and the third node by a second gate of the second transistor connecting to the first node and a second source and a second drain of the second transistor both connecting to the third node.

6. The input stage of claim 1, wherein the input node is configured to receive a single-ended signal as an input to the analog-to-digital converter circuit.

7. The input stage of claim 1, wherein the set of switches is manipulated to put the analog-to-digital converter circuit in the first configuration, the first configuration being a sampling configuration in which:

the first node is connected to the input node and disconnected from the first output node;

the second node is connected to the first reference node and disconnected from the second output node; and the third node is connected to the second reference node and disconnected from the second output node.

8. The input stage of claim 1, wherein the set of switches is manipulated to put the analog-to-digital converter circuit in the second configuration, the second configuration being a conversion configuration in which:

the first node is connected to the first output node and disconnected from the input node;

the second node is connected to the second output node and disconnected from the first reference node; and the third node is connected to the second output node and disconnected from the second reference node.

9. The input stage of claim 8, wherein:

the set of switches is manipulated to put the analog-to-digital converter circuit in the conversion configuration during a conversion phase;

at a first time during the conversion phase, at least one of the first transistor or the second transistor is activated such that a transistor capacitance is enabled for use in storing a sampled charge that was captured during a sampling phase prior to the first time; and at a second time during the conversion phase, both the first transistor and the second transistor are deactivated such that the transistor capacitance is disabled and a corresponding voltage boost is applied between the first output node and the second output node as the sampled charge is conserved.

10. The input stage of claim 8, wherein:

based on a sampled charge conserved within a transistor capacitance between the first output node and the second output node when the analog-to-digital converter circuit is in the conversion configuration, a differential signal corresponding to the sampled charge is generated on the first output node and the second output node; and the differential signal is received by a first input and a second input of a comparator included within the analog-to-digital converter circuit.

11. The input stage of claim 1, wherein the analog-to-digital converter circuit implements a charge-sharing successive-approximation-register (CS-SAR) analog-to-digital converter that operates in a charge domain instead of a voltage domain.

12. The input stage of claim 1, wherein:

the first transistor has a first bulk terminal and the second transistor has a second bulk terminal; and the set of switches is further configured, when manipulated by the controller, to connect:

the first bulk terminal to either the first reference node or a first shifted supply node, and the second bulk terminal to either the second reference node or a second shifted supply node.

13. The input stage of claim 12, wherein the set of switches is manipulated to put the analog-to-digital converter circuit in a voltage-shift configuration in which:

the first bulk terminal is connected to the first shifted supply node;

the second bulk terminal is connected to the second shifted supply node;

the first node is floating disconnected from both the input node and the first output node;

the second node is floating disconnected from both the first reference node and the second output node; and the third node is floating disconnected from both the second reference node and the second output node.

14. The input stage of claim 1, wherein the input stage is one of a plurality of input stages that share parallel access to a singular comparator and a singular digital-to-analog feedback circuit of the analog-to-digital converter circuit.

15. The input stage of claim 1, wherein:

the analog-to-digital converter circuit is implemented as part of an image readout circuit included within an image sensor integrated circuit;

the input stage is associated with a particular column of a plurality of columns within the image sensor integrated circuit; and the input stage receives, at the input node, a single-ended column readout signal for the particular column.

16. An analog-to-digital converter circuit comprising:

a comparator having a first input and a second input;

an input stage including:

a first transistor of a first conductivity type, the first transistor being connected between a first node and a second node; and a second transistor of a second conductivity type, the second transistor being connected between the first node and a third node;

a digital-to-analog feedback circuit including a series of successive-approximation capacitors; and a set of switches configured, when manipulated by a controller, to connect:

the first node to either an input node or the first input of the comparator, the second node to either a first reference node or the second input of the comparator, the third node to either a second reference node or the second input of the comparator, and with either a positive polarity or a negative polarity, each capacitor of the series of successive-approximation capacitors between the first input and the second input of the comparator.

17. The analog-to-digital converter circuit of claim 16, wherein:

the first conductivity type is a P-type and the second conductivity type is an N-type;

the first transistor is connected between the first node and the second node by a first gate of the first transistor connecting to the first node and a first source and a first drain of the first transistor both connecting to the second node; and the second transistor is connected between the first node and the third node by a second gate of the second transistor connecting to the first node and a second source and a second drain of the second transistor both connecting to the third node.

18. The analog-to-digital converter circuit of claim 16, wherein:

the input node is configured to receive a single-ended signal as an input to the analog-to-digital converter circuit; and the analog-to-digital converter circuit implements a charge-sharing successive-approximation-register (CS-SAR) analog-to-digital converter that operates in a charge domain instead of a voltage domain.

19. The analog-to-digital converter circuit of claim 16, wherein the set of switches is further configured, when manipulated by the controller, to connect each capacitor of the series of successive approximation capacitors between a first precharge reference node and a second precharge reference node.

20. A method for an analog-to-digital converter circuit that includes an input stage with a first transistor of a first conductivity type connected between a first node and a second node and a second transistor of a second conductivity type connected between the first node and a third node, the method comprising:

manipulating a set of switches to put the analog-to-digital converter circuit in a sampling configuration in which:

the first node is connected to an input node and disconnected from a comparator, the second node is connected to a first reference node and disconnected from the comparator, and the third node is connected to a second reference node and disconnected from the comparator; and manipulating the set of switches to put the analog-to-digital converter circuit in a conversion configuration in which:

the first node is disconnected from the input node and connected to a first input of the comparator, the second node is disconnected from the first reference node and connected to a second input of the comparator, and the third node is disconnected from the second reference node and connected to the second input of the comparator.

* * * * *